(12) United States Patent
Yen et al.

(10) Patent No.: US 11,791,245 B2
(45) Date of Patent: Oct. 17, 2023

(54) ELECTRONIC PACKAGE AND METHOD FOR MANUFACTURING THE SAME

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US); Kay Stefan Essig, Radebeul (DE)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 28 days.

(21) Appl. No.: 17/395,215

(22) Filed: Aug. 5, 2021

(65) Prior Publication Data

US 2023/0039430 A1    Feb. 9, 2023

(51) Int. Cl.
*H01L 23/495* (2006.01)
*H01L 25/065* (2023.01)
*H01L 25/00* (2006.01)
*H01L 23/31* (2006.01)

(52) U.S. Cl.
CPC .... *H01L 23/49503* (2013.01); *H01L 23/3107* (2013.01); *H01L 23/4952* (2013.01); *H01L 25/0657* (2013.01); *H01L 25/50* (2013.01); *H01L 2225/06517* (2013.01); *H01L 2225/06548* (2013.01)

(58) Field of Classification Search
CPC ......... H01L 23/49503; H01L 23/3107; H01L 23/4952; H01L 25/0657; H01L 25/50; H01L 2225/06517; H01L 2225/06548; H10B 80/00
See application file for complete search history.

(56) References Cited

U.S. PATENT DOCUMENTS

2020/0313675 A1* 10/2020 Lee ................ H03K 19/1776

* cited by examiner

Primary Examiner — Timor Karimy
(74) Attorney, Agent, or Firm — FOLEY & LARDNER LLP

(57) ABSTRACT

An electronic package includes a patterned conductive layer and at least one conductive protrusion on the patterned conductive layer. The at least one conductive protrusion has a first top surface. The patterned conductive layer and the at least one conductive protrusion define a space. The electronic package further includes a first electronic component disposed in the space and a plurality of conductive pillars on the first electronic component. The conductive pillars have a second top surface. The first top surface is substantially level with the second top surface.

18 Claims, 20 Drawing Sheets

ELECTRONIC PACKAGE AND METHOD FOR MANUFACTURING THE SAME

1. Technical Field

The present disclosure relates to an electronic package and a method for manufacturing the same.

2. Description of the Related Art

In an electronic package technology, such as the embedded die packaging technology, a semiconductor die is embedded on a leadframe and is electrically connected to other electronic components through conductive vias and conductive traces. The electronic packages require integration of more chips and functions, higher performance, lower power consumption and better heat dissipation onto a smaller form factor. Moreover, a process for manufacturing the electronic package needs to be optimized and simplified to increase yield and reduce cost.

SUMMARY

In some embodiments, an electronic package includes a patterned conductive layer and at least one conductive protrusion on the patterned conductive layer. The at least one conductive protrusion has a first top surface. The patterned conductive layer and the at least one conductive protrusion define a space. The electronic package further includes a first electronic component disposed in the space and a plurality of conductive pillars on the first electronic component. The conductive pillars have a second top surface. The first top surface is substantially level with the second top surface.

In some embodiments, an electronic package includes a patterned conductive layer and at least one conductive protrusion on the patterned conductive layer. The patterned conductive layer and the at least one conductive protrusion define a space. The electronic package also includes a first electronic component disposed in the space, a second electronic component stacked on the first electronic component and uncovering a portion of the first electronic component, and a plurality of conductive pillars on the portion of the first electronic component. The electronic package further includes a dielectric layer embedding the first electronic component and the second electronic component.

In some embodiments, a method for manufacturing an electronic package includes: providing a patterned conductive layer; forming a plurality of conductive protrusions on the patterned conductive layer by an additive process to define a space on the patterned conductive layer; disposing an electronic component in the space on the patterned conductive layer; and forming a conductive pillar on the electronic component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
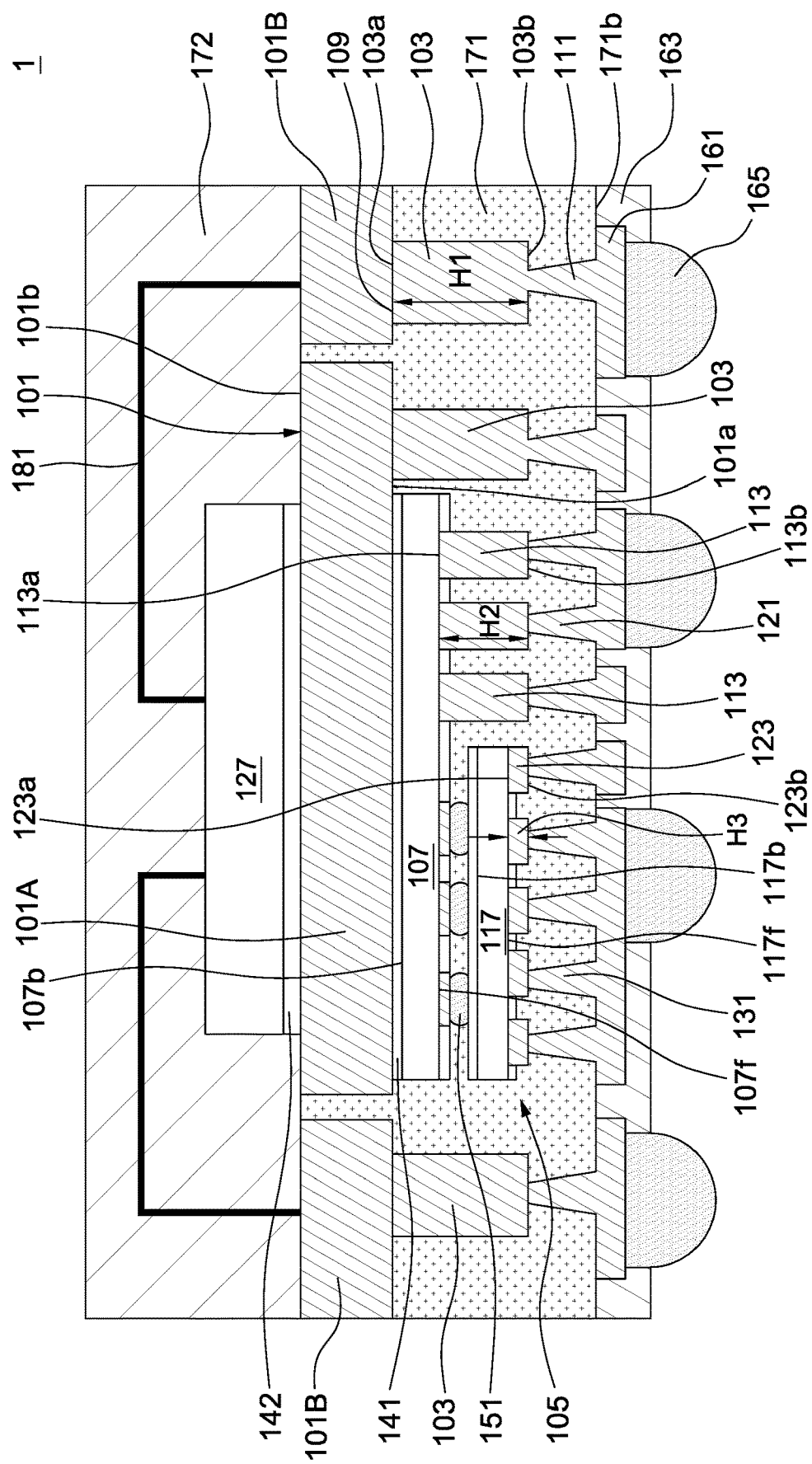
FIG. 1 illustrates a schematic cross-sectional view of an electronic package in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the technology of advanced embedded active system integration (a-EASI), a drain via may be formed on a patterned conductive layer (such as a leadframe), and a source via and a gate via may be formed on an electronic component (such as a semiconductor die, e.g., a power MOSFET die) which is attached onto the patterned conductive layer. Therefore, the drain via and the source via have very different aspect ratios, causing difficulty in laser drill during the formation of the drain via and the source via. One solution to solve the issue of different aspect ratios of the vias is to form a cavity in the patterned conductive layer (such as a leadframe) to accommodate the electronic component (such as a semiconductor die) by an etching operation to reduce the difference in the aspect ratios between the drain via and the source via. However, it is difficult to have a flat bottom surface of the cavity by the etching operation. Usually, to have a sufficiently flat bottom surface of the cavity, the size of the cavity needs to be made significantly larger (e.g., twice larger) than the electronic component to be accommodated, resulting in waste of space.

In some aspects of the present disclosure, an electronic package is provided with conductive protrusions, such as conductive pillars, formed on a patterned conductive layer (such as a leadframe) so that the conductive protrusions and the patterned conductive layer together define a space to accommodate an electronic component such as a semiconductor die, e.g., a MOSFET die. The conductive protrusions of the present disclosure allow the drain via and the source via to have similar aspect ratios. Thus, the process for forming the vias by, for example, laser drill, can be controlled more easily and accurately. In addition, the issue of the non-flat bottom surface of the etched patterned conductive layer (such as a leadframe) can be avoided. The conductive pillars of the present disclosure may be formed by electroplating and thus the dimensions can be controlled more accurately. Moreover, the space defined by the conductive protrusions of the present disclosure and the patterned conductive layer do not need to be made significantly larger than the electronic component to be accommodated therein as compared to a comparative approach of etching patterned conductive layer (such as a leadframe), thereby facilitating miniaturization of the electronic package. In some aspects of the present disclosure, the drain via and the source via are formed on the conductive protrusions. Therefore, laser drilling of the vias on contact pads of the electronic component can be avoided or at least decreased, and thus damage to the electronic component during the laser drilling can be prevented or at least mitigated. In some aspects of the present disclosure, electronic components, such as MOSFET dies, have contact pads not only on a front surface but also on a backside surface. Therefore, the electronic components can be stacked. An electrical signal and power for one of the electronic components can be transmitted or provided via a pathway(s) through the other electronic component. As a result, the electrical signal and power pathway(s) can be shortened, thereby facilitating shrinkage of the electronic package.

FIG. 1 illustrates a schematic cross-sectional view of an electronic package 1 in accordance with some embodiments of the present disclosure. The electronic package 1 includes a patterned conductive layer 101. In some embodiments, the patterned conductive layer 101 includes a leadframe. The patterned conductive layer 101 has a first surface 101a and a second surface 101b opposite to the first surface 101a. At least one conductive protrusion 103 are disposed on the first surface 101a of the patterned conductive layer 101. In some embodiments, the at least one conductive protrusion 103 include a conductive pillar, such as a copper pillar. The at least one conductive protrusion 103 have a first lower surface (also referred to as a first bottom surface) 103a in contact with the patterned conductive layer 101 and a first upper surface (also referred to as a first top surface) 103b opposite to the first lower surface 103a. The first lower surface 103a of the at least one conductive protrusion 103 forms an interface 109 with the first surface 101a of the patterned conductive layer 101. In some embodiments, the at least one conductive protrusion 103 are electrically connected to the patterned conductive layer 101. In some embodiments, the at least one conductive protrusion 103 and the patterned conductive layer 101 are formed from different materials. In some embodiments, the at least one conductive protrusion 103 and the patterned conductive layer 101 are formed by different steps or processes. As a result, the at least one conductive protrusion 103 and the patterned conductive layer 101 are metallographically or crystallographically distinct. In some examples, the at least one conductive protrusion 103 and the patterned conductive layer 101 may have distinct grain sizes, grain spacings (such as average grain spacings), numbers of grain boundaries per unit length at the interface 109, and/or metallographic/crystalline phases. In some embodiments, the metallography is measured on a cross section of the at least one conductive protrusion 103 and a cross section of the patterned conductive layer 101, respectively, using a microscope. In some embodiments, the at least one conductive protrusion 103 include electroplated copper and the patterned conductive layer 101 include copper alloy. Examples of the electroplated copper include, but are not limited to, copper, such as pure copper. Examples of the copper alloy include, but are not limited to, copper-iron (Cu—Fe) alloy, copper-iron-phosphorus (Cu—Fe—P) alloy, copper-nickel (Cu—Ni) alloy, the like, or a combination thereof. In some embodiments, the first lower surface 103a of each of the at least one conductive protrusion 103 is substantially level with each other. In some embodiments, the first upper surface 103b of each of the at least one conductive protrusion 103 is substantially level with each other.

The patterned conductive layer 101 and the at least one conductive protrusion 103 define a space 105 for accommodation of a die or dies. A first electronic component 107 is disposed in the space 105 on the patterned conductive layer 101. In some embodiments, the first electronic component 107 is electrically connected to the patterned conductive layer 101. The first electronic component 107 has a first backside surface 107b and a first front surface 107f opposite to the first backside surface 107b, and the first backside surface 107b is closer to the patterned conductive layer 101 than the first front surface 107f is. In some embodiments, at least one of the at least one conductive protrusion 103 is electrically connected to the first backside surface 107b of the first electronic component 107 through the patterned conductive layer 101. In some embodiments, the first backside surface 107b of the first electronic component 107 includes at least one contact pad (not shown). In some embodiments, the first front surface 107f of the first electronic component 107 includes at least one contact pad (not shown). In some embodiments, the first front surface 107f and the first backside surface 107b of the first electronic component 107 both include at least one contact pad (not shown). In some embodiments, the first electronic component 107 includes a conductive through via, such as through silicon via (TSV), for example, in electrical connection with the patterned conductive layer 101 and/or a second electronic component 117 stacked on the first electronic component 107. In some embodiments, the first electronic component 107 is a semiconductor die and may be referred to as a first semiconductor die 107. In some embodiments, the first electronic component 107 is a MOSFET die. In some embodiments, the first electronic component 107 is a power MOSFET die with vertical current flow.

Compared to a comparative embodiment of etching a patterned conductive layer to form a space, i.e., a cavity, to accommodate an electronic component, the space 105 for accommodation of an electronic component is defined by the patterned conductive layer 101 and the at least one conductive protrusion 103. Unlike the comparative embodiment, the space 105 does not need to be made significantly larger (e.g., twice larger) than the first electronic component 107 in order to achieve a flat bottom surface, thereby facilitating miniaturization of the electronic package. The issue of the non-flat bottom surface of the etched patterned conductive layer can be avoided.

In some embodiments as shown in FIG. 1, a first attachment layer 141 is disposed between the first backside surface 107b of the first electronic component 107 and the first surface 101a of the patterned conductive layer 101. In some embodiments, the first attachment layer 141 attaches the first electronic component 107 to the patterned conductive layer 101. In some embodiments, the first attachment layer 141 is electrically conductive. In some embodiments, the first attachment layer 141 electrically connects the first electronic component 107 to the patterned conductive layer 101. In some embodiments, at least one of the at least one conductive protrusion 103 is electrically connected to the backside surface 107b of the first electronic component 107 through the die paddle region 101A of the patterned conductive layer 101 and the first attachment layer 141. In some embodiments, the first attachment layer 141 includes a solder material, such as Sn/Au solder, but the present disclosure is not limited thereto.

As shown in FIG. 1, the patterned conductive layer 101 includes a leadframe having a die paddle region 101A and a lead region 101B around the die paddle region 101A. The at least one conductive protrusion 103 are disposed on the die paddle region 101A and/or the lead region 101B. The first electronic component 107 is disposed on the die paddle region 101A. The first backside surface 107b of the first electronic component 107 is attached to the die paddle region 101. In some embodiments, the die paddle region 101A of the leadframe includes a first surface 101a for placement of the first electronic component 107 and a second surface 101b opposite to the first surface 101a, and a roughness, such as an average roughness, of the first surface 101a of the die paddle region 101A is substantially the same as a roughness, such as an average roughness, of the second surface 101b of the die paddle region 101A. In some examples, the average roughness of a surface is represented by Ra, but the present disclosure is not limited thereto.

In a comparative embodiment, a paddle region of a leadframe is etched to form a space, i.e., a cavity, to accommodate an electronic component, and consequently an upper surface and its opposite surface of the paddle region of the leadframe have different surface roughness. As compared to the comparative embodiment, the space 105 for accommodation of the first electronic component 107 is defined by the patterned conductive layer 101 and the at least one conductive protrusion 103, and the paddle region 101A of the leadframe is not etched to form the space 105. Consequently, the average roughness of the first surface 101a of the paddle region 101A is substantially the same as the average roughness of the second surface 101b of the paddle region 101A.

As illustrated in FIG. 1, at least one second conductive pillar 113 is disposed on the first electronic component 107. In some embodiments, the second conductive pillar 113 includes a copper pillar. In some embodiments, the second conductive pillar 113 and the at least one conductive protrusion 103 are formed by different steps or processes. As a result, the second conductive pillar 113 and the at least one conductive protrusion 103 are metallographically or crystallographically distinct. In some examples, the second conductive pillar 113 and the at least one conductive protrusion 103 may have distinct grain sizes, grain spacings (such as average grain spacings), numbers of grain boundaries per unit length at the interface 109, and/or metallographic or crystalline phases. In some embodiments, the second conductive pillar 113 is electrically connected to the first electronic component 107. The second conductive pillar 113 has a second lower surface (also referred to as a second bottom surface) 113a in contact with the first electronic component 107 and a second upper surface (also referred to as a second top surface) 113b opposite to the second lower surface 113a. The at least one conductive protrusion 103 have a first height H1, and the second conductive pillar 113 has a second height H2. The second height H2 is smaller than the first height H1. In some embodiments, the first upper surface 103b of the first conductive pillar 103 is substantially level with the second upper surface 113b of the second conductive pillar 113.

As shown in FIG. 1, a second electronic component 117 is stacked on the first electronic component 107 and adjacent to or aside the second conductive pillar 113. In some embodiments, the second electronic component 117 exposes or uncovers a portion of the first electronic component 107, and the second conductive pillar 113 is disposed on the exposed or uncovered portion of the first electronic component 107. In some embodiments, the second electronic component 117 is electrically connected to the first electronic component 107. The second electronic component 117 has a second backside surface 117b and a second front surface 117f opposite to the second backside surface 117b, and the second backside surface 117b is closer to the first front surface 107f of the first electronic component 107 than the second front surface 117f is. In some embodiments, the second conductive pillar 113 is electrically connected to the first front surface 107f of the first electronic component 107. In some embodiments, the second backside surface 117b of the second electronic component 117 is electrically connected to the first front surface 107f of the first electronic component 107. In some embodiments, the second electronic component 117 comprises a conductive through via, such as a through silicon via (TSV). In some embodiments, the conductive through via of the second electronic component 117 is electrically connected to the first electronic component 107. In some embodiments, the second electronic component 117 is electrically connected to the patterned conductive layer 101 through the first electronic component 107. In some embodiments, the second backside surface 117b of the second electronic component 117 includes at least one contact pad (not shown). In some embodiments, the second front surface 117f of the first electronic component 117 includes at least one contact pad (not shown). In some embodiments, the second front surface 117f and the second backside surface 117b of the second electronic component 117 both include at least one contact pad (not shown). In some embodiments, the second electronic component 117 is a semiconductor die and may be referred to as a second semiconductor die 117. In some embodiments, the second electronic component 117 is a MOSFET die. In some embodiments, the second electronic component 117 is a power MOSFET die.

In some embodiments as shown in FIG. 1, a conductive structure 151 is disposed between the first front surface 107f of the first electronic component 107 and the second backside surface 117b of the second electronic component 117. The conductive structure 151 attaches the second electronic component 117 to the first electronic component 107. In some embodiments, the conductive structure 151 electrically connects the second electronic component 117 to the first electronic component 107. In some embodiments, the conductive structure 151 includes a metallic material. In some embodiments, the conductive structure 151 includes a solder material.

In some embodiments as shown in FIG. 1, a third conductive pillar 123 is disposed on the second electronic component 117. The third conductive pillar 123 is electrically connected to the second front surface 117f of the second electronic component 117. The third conductive pillar 123 has a third height H3. The third height H3 of the third conductive pillar 123 is smaller than the second height H2 of the second conductive pillar 113. The third conductive pillar 123 has a third lower surface (also referred to as a third bottom surface) 123a in contact with the second electronic component 117 and a third upper surface (also referred to as a third top surface) 123b opposite to the third lower surface 123a. In some embodiments, the third upper surface 123b of the third conductive pillar 123 is substantially level with the second upper surface 113b of the second conductive pillar 113.

In some embodiments as shown in FIG. 1, a first conductive via 111 is disposed on the at least one conductive protrusion 103. A second conductive via 121 is disposed on the second conductive pillar 113. A third conductive via 131 is disposed on the third conductive pillar 123. In some embodiments, at least two of a depth of the first conductive via 111, a depth of the second conductive via 121 and a depth of the third conductive via 131 are substantially the same. In some examples, a depth of the first conductive via 111 is substantially the same as a depth of the second conductive via 121. In some examples, a depth of the second conductive via 121 is substantially the same as a depth of the third conductive via 131. In some examples, a depth of the first conductive via 111, a depth of the second conductive via 121 and a depth of the third conductive via 131 are substantially the same.

In some embodiments, since the second height H2 of the second conductive pillar 113 is smaller than the first height H1 of the first conductive pillar and/or the third height H3 of the third conductive pillar 123 is smaller than the second height H2 of the second conductive pillar 113, the difference between the depths of the first conductive via 111, the second conductive via 121 and the third conductive via 131 can be decreased. In some embodiments, since the first upper surface 103b of the first conductive pillar 103 is substantially level with the second upper surface 113b of the second conductive pillar 113, and/or the third upper surface 123b of the third conductive pillar 123 is substantially level with the second upper surface 113b of the second conductive pillar 113, at least two of a depth of the first conductive via 111, a depth of the second conductive via 121 and a depth of the third conductive via 131 can be made substantially the same. That is, the difference between the aspect ratios of the first conductive via 111, the second conductive via 121 and the third conductive via 131 can be decreased. As a result, a process for forming the first conductive via 111, the second conductive via 121 and the third conductive via 131 can be simplified and can be controlled more accurately.

In some embodiments, the second conductive via 121 and the third conductive via 131 are formed on the second conductive pillar 113 and the second conductive pillar 123, respectively, instead of directly on contacts pads of the first electronic component 107 and the second electronic component 117. Consequently, damage to the electronic components 107, 117 caused by a process for forming) the conductive vias by, e.g., laser drilling, can be prevented or at least mitigated.

In some embodiments, the first conductive via 111 is electrically connected to the backside surface 107b of the first electronic component 107 through at least one of the at least one conductive protrusion 103 and the die paddle region 101B of the patterned conductive layer 101, and the first conductive via 111 functions as a drain terminal for delivering signal to a drain electrode disposed on the backside surface 107b of the first electronic component 107. In some embodiments, the second conductive via 121 is electrically connected to the front surface 107f of the first electronic component 107 through the second conductive pillar 113, and the second conductive via 121 functions as a source terminal or a gate terminal for delivering signal to a source electrode or a gate electrode disposed on the front surface 107f of the first electronic component 107.

In some embodiments as shown in FIG. 1, a dielectric layer 171, such as a molding layer, is disposed over the first surface 101a of the patterned conductive layer 101 and covers the first, second and third conductive pillars 103, 113, 123, the first, second and third conductive vias 111, 121, 131 and the first and second electronic components 107, 117. The first and second electronic components 107, 117 are embedded in the dielectric layer 171. The dielectric layer 171 has an upper surface 171b away from the patterned conductive layer 101. In some embodiments, a distance between the first upper surface 103b of the first conductive pillar 103 and the upper surface 171b of the dielectric layer 171 is substantially the same as a distance between the second upper surface 113b of the second conductive pillar 113 and the upper surface 171b of the dielectric layer 171. In some embodiments, a distance between the second upper surface 113b of the second conductive pillar 113 and the upper surface 171b of the dielectric layer 171 is substantially the same as a distance between the third upper surface 123b of the third conductive pillar 123 and the upper surface 171b of the dielectric layer 171. In some embodiments, a distance between the first upper surface 103b of the first conductive pillar 103 and the upper surface 171b of the dielectric layer 171 is substantially the same as a distance between the second upper surface 113b of the second conductive pillar 113 and the upper surface 171b of the dielectric layer 171 and a distance between the third upper surface 123b of the third conductive pillar 123 and the upper surface 171b of the dielectric layer 171.

In some embodiments as shown in FIG. 1, a circuit layer 161 is disposed on the dielectric layer 171, the first conductive vias 111, the second conductive vias 121 and the third conductive vias 131. In some embodiments, the circuit layer 161 includes multiple conductive layers. In some embodiments, the circuit layer 161 include a redistribution layer (RDL). In some embodiments, the circuit layer 161 electrically connects at least two of the first conductive vias 111. In some embodiments, the circuit layer 161 electrically connects at least two of the second conductive vias 121. In some embodiments, the circuit layer 161 electrically connects at least two of the third conductive vias 131. In some embodiments, the circuit layer 161 electrically connects at least two of the first conductive vias 111, the second conductive vias 121 and the third conductive vias 131. A passivation layer 163 is disposed on and covers the circuit layer 161. In some embodiments, the passivation layer 163 includes a dielectric material. The passivation layer 163 is patterned to expose portions of the circuit layer 161. First Electrical conductors 165, such as solder balls, are disposed on the portions of the circuit layer 161 exposed through the passivation layer 163.

In some embodiments as shown in FIG. 1, an electronic device, such as a third electronic component 127, is disposed on the second surface 101b of the patterned conductive layer 101. In some embodiments, the third electronic component 127 is a semiconductor die and may be referred to as a third semiconductor die 127. In some embodiments, the third electronic component 127 is a logic semiconductor die. A second attachment layer 142 is disposed between the third electronic component 127 and the patterned conductive layer 101. The third electronic component 127 is attached to the patterned conductive layer 101 by the second attachment layer 142. In some embodiments, the second attachment layer 142 is electrically insulating. In some embodiments, the second attachment layer 142 includes an adhesive material. In some embodiments, a conductive wire 181, such as a wire bond, electrically connects the third electronic component 127 to the patterned conductive layer 101. In some embodiments, the third electronic component 127 is electrically connected to the lead region 101B of the patterned conductive layer 101. An encapsulant 172, such as a molding layer, is disposed on the second surface 101b of the patterned conductive layer 101. The encapsulant 172 covers or encapsulates the third electronic component 127 and the conductive wire 181.

Figure 2A:
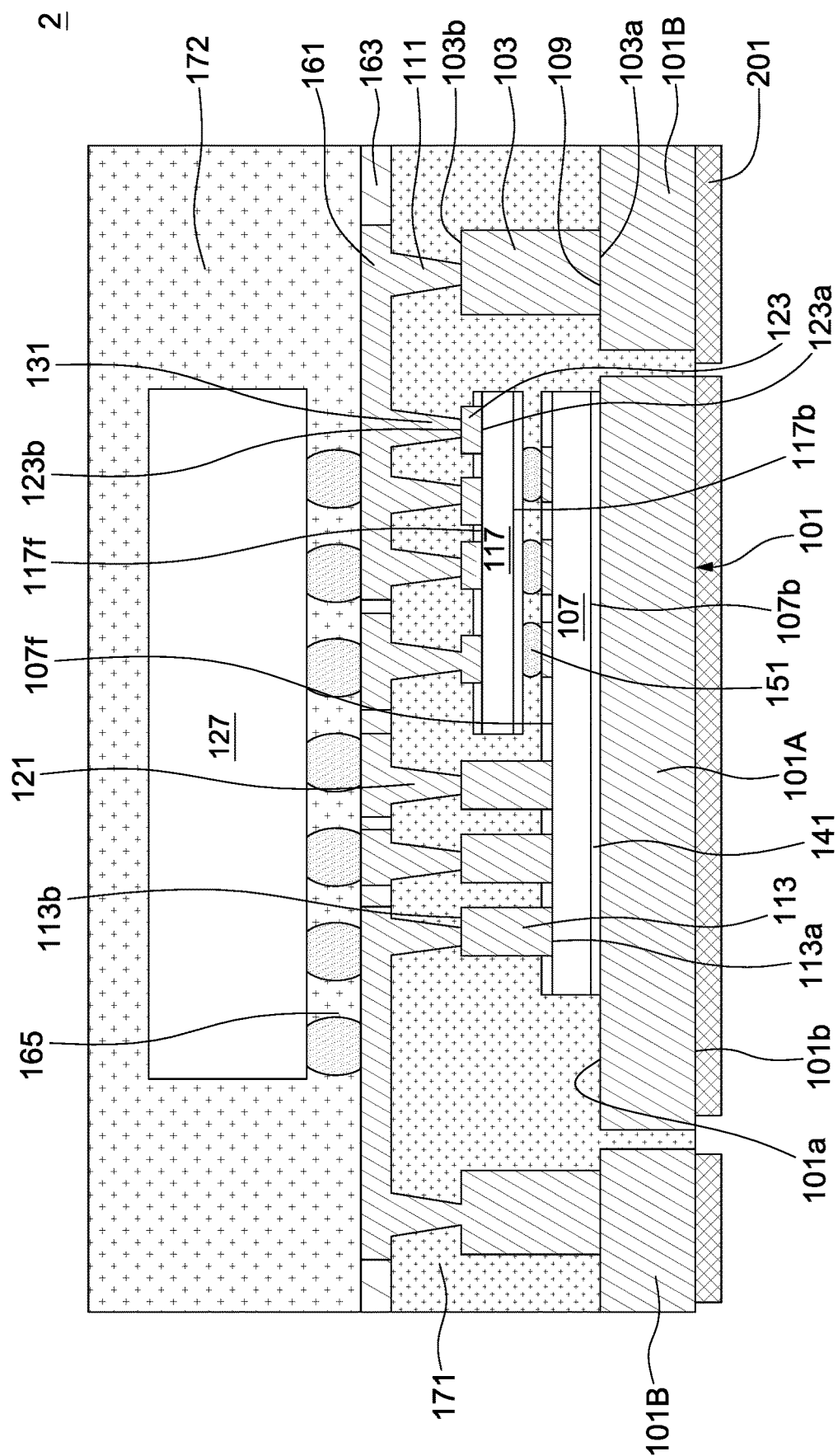
FIG. 2A illustrates a schematic cross-sectional view of an electronic package in accordance with some embodiments of the present disclosure.

FIG. 2A illustrates a schematic cross-sectional view of an electronic package 2 in accordance with some embodiments of the present disclosure. The electronic package 2 is similar to the electronic package 1 as described and illustrated with reference to FIG. 1, except that the electronic device, such as the third electronic component 127, is disposed over the second electronic component 117 on the first surface 101a of the patterned conductive layer 101. The electronic component, such as the third electronic component 127, is disposed on the circuit layer 161 and is electrically connected to the circuit layer 161. In some embodiments, first electrical conductors 165 are disposed between the third electronic component 127 and the circuit layer 161. The encapsulant 172 is disposed on the circuit layer 161 over the first surface 101a of the patterned conductive layer. The encapsulant 172 covers or encapsulates the third electronic component 127 and the first electrical conductors 165. A second electrical conductor 201, such as land grind array (LGA), is disposed on the second surface 101b of the patterned conductive layer 101. In some embodiments, the third electronic component 127 is electrically connected to the second electronic component 117 through the first electrical conductor 165, the third conductive via 131 and the third conductive pillar 123. In some embodiments, the third electronic component 127 is electrically connected to the first electronic component 107 through the first electrical conductor 165, the second conductive via 121 and the second conductive pillar 113. In some embodiments, the third electronic component 127 is electrically connected to the second electronic component 117 through the first electrical conductor 165, the third conductive via 131 and the third conductive pillar 123. In some embodiments, the circuit layer 161 electrically connects the first conductive pillar 103 to the second conductive pillar 113. In some embodiments, the circuit layer 161 electrically connects the first conductive pillar 103 to the third conductive pillar 123.

Figure 2B:
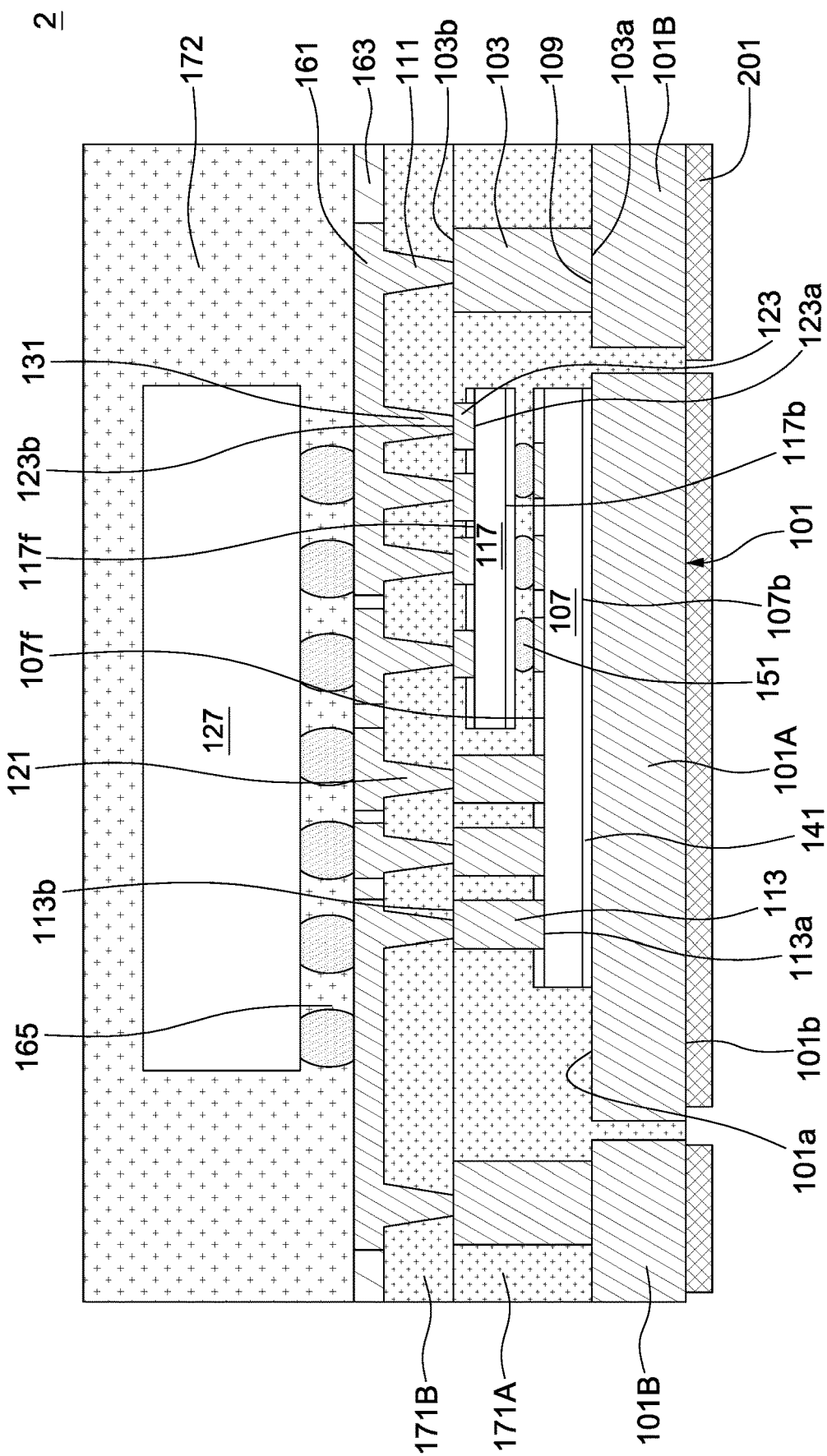
FIG. 2B illustrates a schematic cross-sectional view of an electronic package in accordance with some embodiments of the present disclosure.

FIG. 2B illustrates a schematic cross-sectional view of an electronic package 2 in accordance with some embodiments of the present disclosure. The electronic package 2 shown in FIG. 2B is similar to the electronic package 2 as described and illustrated with reference to FIG. 2A, except that a first dielectric layer 171A is disposed over the first surface 101a of the patterned conductive layer 101, and a second dielectric layer 171B is disposed on the first dielectric layer 171A. The first and second electronic components 107, 117 are embedded in the first dielectric layer 171A. The first dielectric layer 171A exposes the first upper surface 103b of the first conductive pillars 103, the second upper surface 113b of the first conductive pillars 113 and the third upper surface 123b of the third conductive pillars 123. The first dielectric layer 171A and the second dielectric layer 171B are formed in different steps. In some embodiments, the second dielectric layer 171B is formed on the first dielectric layer 171A after grinding the first dielectric layer 171A to expose the first upper surface 103b of the first conductive pillars 103, the second upper surface 113b of the first conductive pillars 113 and the third upper surface 123b of the third conductive pillars 123. A material of the first dielectric layer 171A may be the same as or different from a material of the second dielectric layer 171B.

Figure 3:
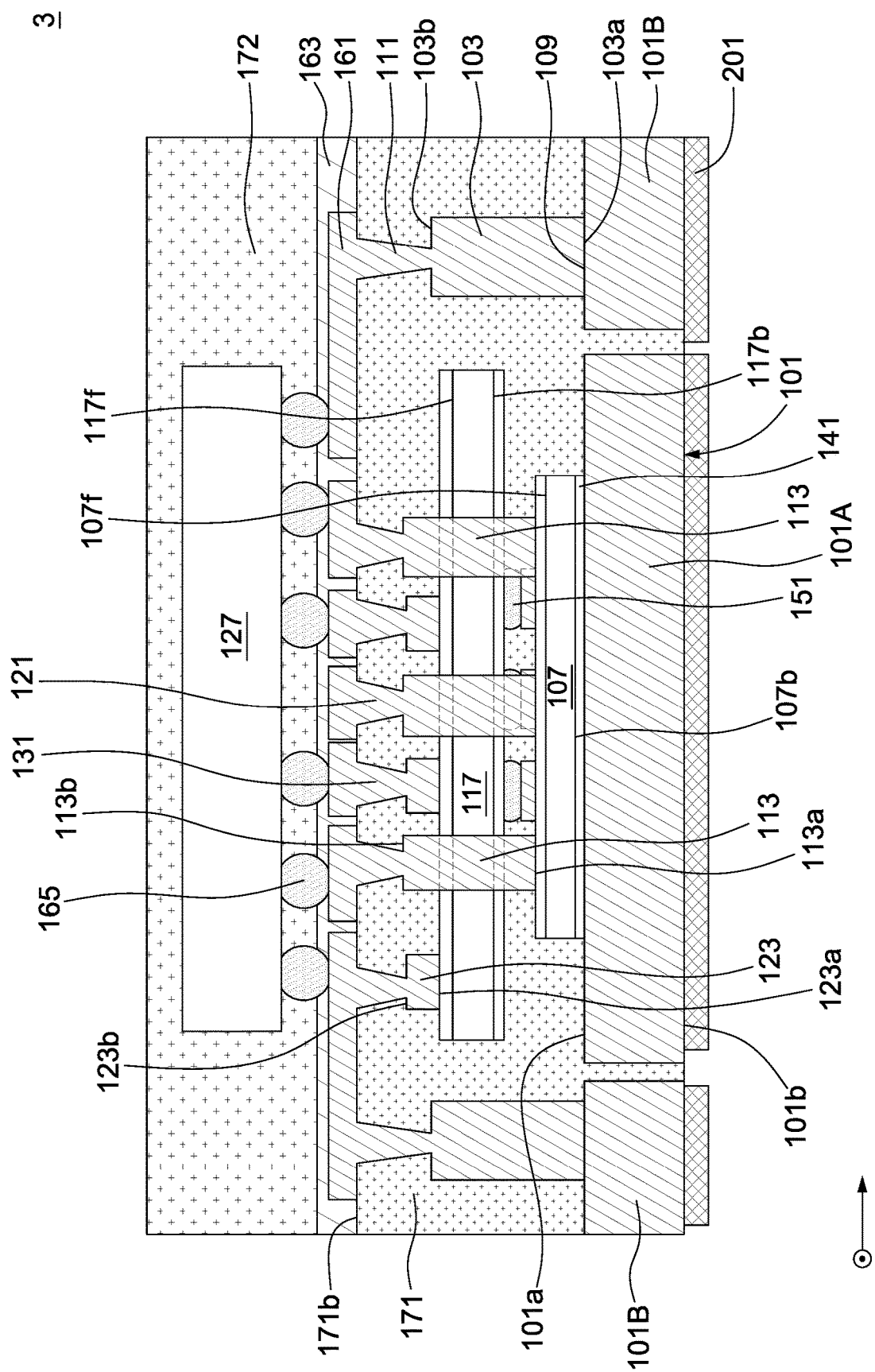
FIG. 3 illustrates a schematic cross-sectional view of an electronic package in accordance with some embodiments of the present disclosure.

FIG. 3 illustrates a cross-sectional view of an electronic package 3 in accordance with some embodiments of the present disclosure. The electronic package 3 is similar to the electronic package 2 as described and illustrated with reference to FIG. 2A, except that a dimension, such as a width, of the second electronic component 117 is larger than a dimension, such as a width, of the first electronic component 107 in a direction D1 from the viewpoint of FIG. 3. The direction D1 is substantially parallel to a first surface 101a of the patterned conductive layer 101. In some embodiments as shown in FIG. 3, the second electronic component 117 partially overlaps the first electronic component 107 in a direction D2 and exposes a portion of the first electronic component 107. The direction D2 is substantially parallel to the first surface 101a of the patterned conductive layer 101 and perpendicular to the first direction D1. The second conductive pillars 113 are disposed on the exposed portion of the first electronic component 107. From the viewpoint of FIG. 3, the second electronic component 117 is located behind the second conductive pillars 113. In some embodiments, the circuit layer 161 electrically connects the second conductive pillar 113 to the third conductive pillar 123.

Figure 4:
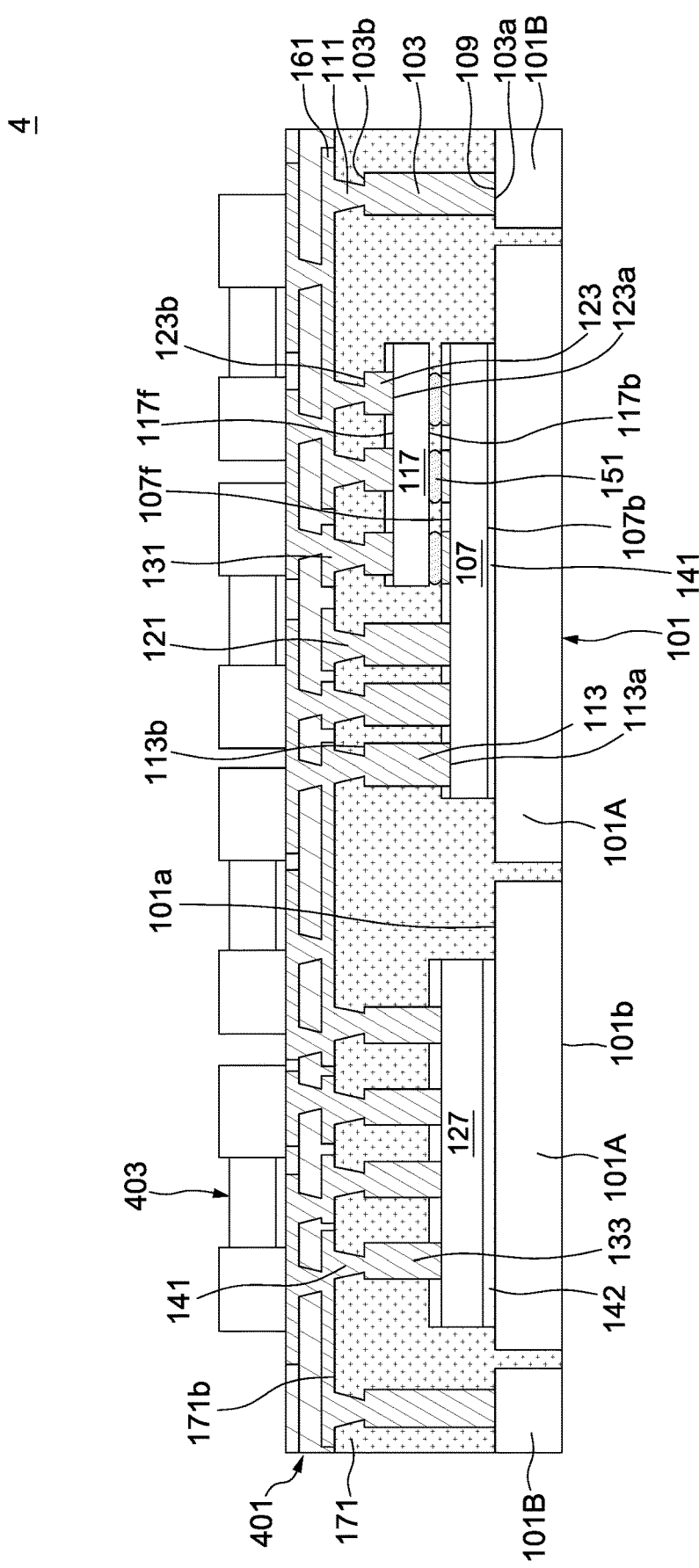
FIG. 4 illustrates a schematic cross-sectional view of an electronic package in accordance with some embodiments of the present disclosure.

FIG. 4 illustrates a schematic cross-sectional view of an electronic package 4 in accordance with some embodiments of the present disclosure. The electronic package 4 is similar to the electronic package 1 as described and illustrated with reference to FIG. 1, except that the electronic device, such as the third electronic component 127, is disposed on the first surface 101a of the patterned conductive layer 101 and adjacent to the first electronic component 107. The patterned conductive layer 101 includes at least two die paddles regions 101A. The first and second electronic components 107, 117 are disposed on one of the die paddle regions 101A, and the third electronic component 127 is disposed on another one of the die paddle regions 101A. At least one fourth conductive pillar 133 is disposed on the third electronic component 127. A fourth conductive via 141 is disposed on the fourth conductive pillar 133. The circuit layer 161 electrically connects the fourth conductive via 141 to the first conductive via 111, the second conductive via 121 or the third conductive via 131. The electronic package 4 further includes a redistribution layer (RDL) 401 on the circuit layer 161 and at least one electronic device 403 on the RDL layer 401. In some embodiments, the electronic device 403 is a passive device, such as a resistor, a capacitor or an inductor. In some embodiments, the electronic device 403 is electrically connected to the first electronic component 107 through the second conductive pillar 113. In some embodiments, the electronic device 403 is electrically connected to the second electronic component 117 through the third conductive pillar 123. In some embodiments, the electronic device 403 is electrically connected to the third electronic component 127 through the fourth conductive pillar 133.

Figure 5:
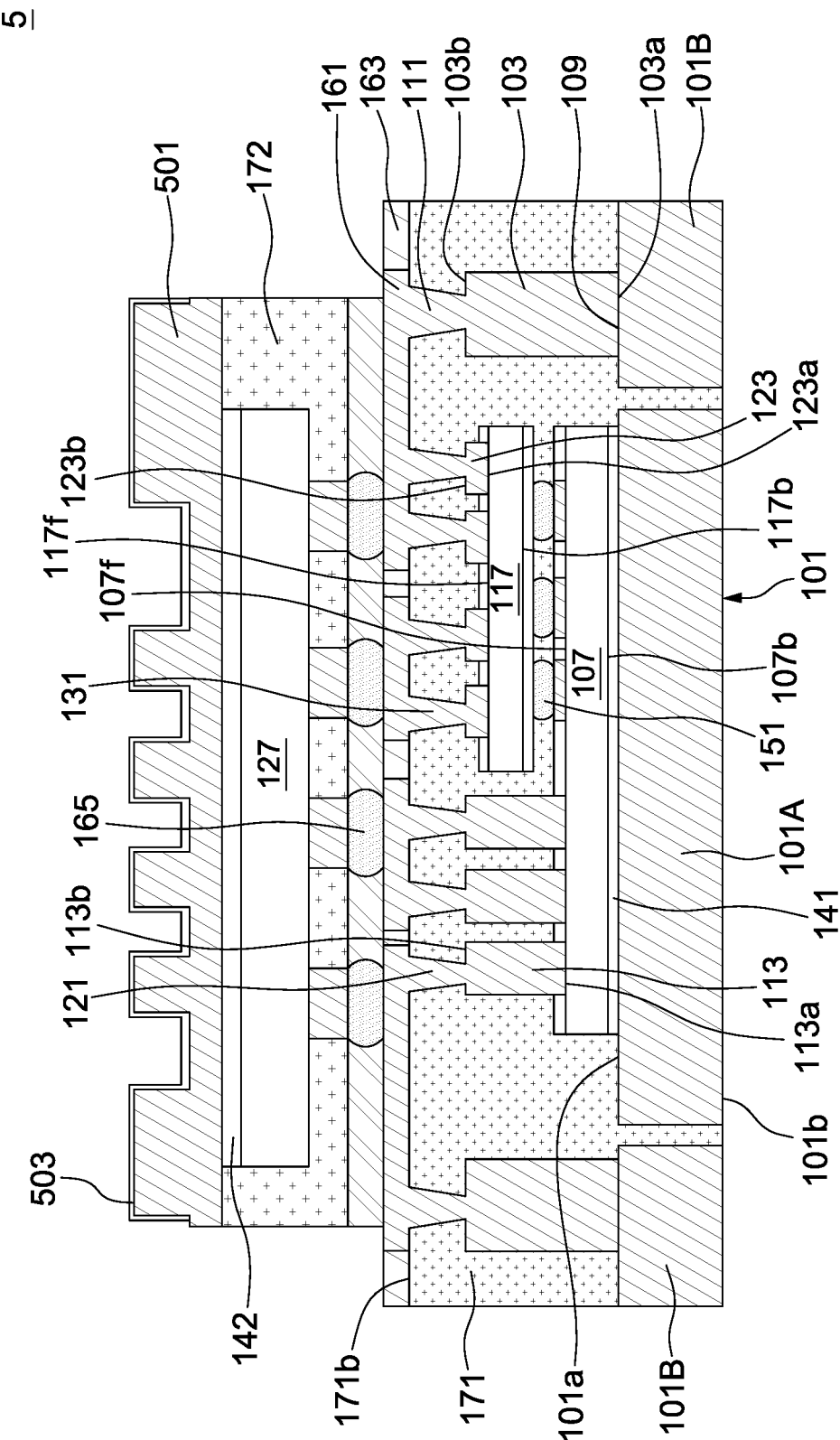
FIG. 5 illustrates a schematic cross-sectional view of an electronic package in accordance with some embodiments of the present disclosure.

FIG. 5 illustrates a schematic cross-sectional view of an electronic package 5 in accordance with some embodiments of the present disclosure. The electronic package 5 is similar to the electronic package 2 as described and illustrated with reference to FIG. 2A, except that the electronic package 5 further includes a heat sink 501 on the electronic device, such as the third electronic component 127, over the first surface 101*a* of the patterned conductive layer 101. The second attachment layer 142 is disposed between the third electronic component 127 and the heat sink 501. The third electronic component 127 is attached to the heat sink 501 by the second attachment layer 142. In some embodiments, the second attachment layer 142 is thermally conductive. In some embodiments, the second attachment layer 142 includes a thermally conductive material. In some embodiments, a protection layer 503 is disposed on the heat sink 501 to prevent the heat sink 501 from oxidation. In some embodiments, the heat sink 501 is a fin-type heat sink as shown in FIG. 5. In some embodiments, the protection layer 503 includes a thermally conductive and anti-oxidation material, such as electroplated NiAu, but the present disclosure is not limited thereto.

Figure 6:
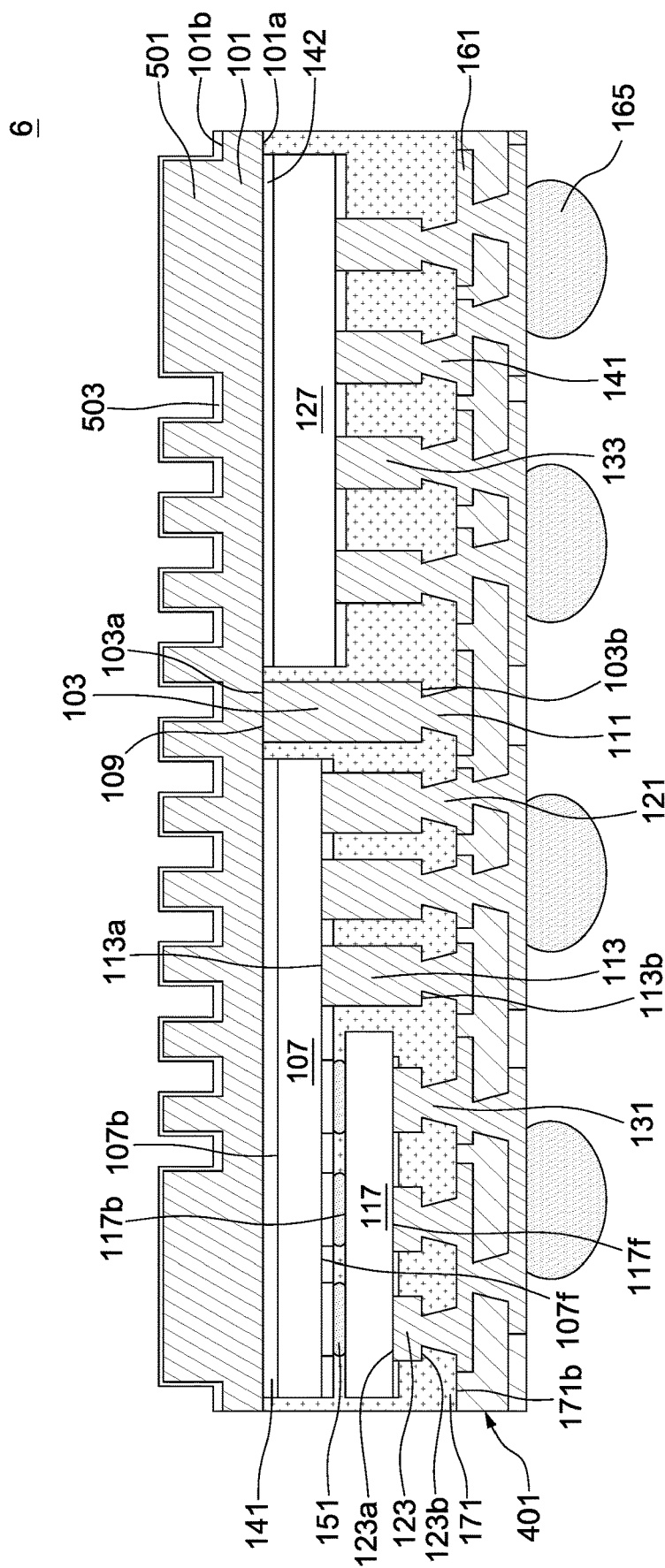
FIG. 6 illustrates a schematic cross-sectional view of an electronic package in accordance with some embodiments of the present disclosure.

FIG. 6 illustrates a schematic cross-sectional view of an electronic package 6 in accordance with some embodiments of the present disclosure. The electronic package 6 is similar to the electronic package 1 as described and illustrated with reference to FIG. 1, except that the electronic device, such as the third electronic component 127, is on the first surface 101*a* of the patterned conductive layer 101, and a heat sink 501 is on the second surface 101*b* of the patterned conductive layer 101. The first electronic component 107 and the second electronic component 117 are disposed on a portion of the first surface 101*a* of the patterned conductive layer 101, and the third electronic component 127 is disposed on another portion of the first surface 101*a* of the patterned conductive layer 101. In some embodiments, the heat sink 501 and the patterned conductive layer 101 are integrally formed as shown in FIG. 6. In some embodiments, the heat sink 501 is formed on the second surface 101*b* of the patterned conductive layer 101 by etching the second surface 101*b* of the patterned conductive layer 101 to form fin structures. In some embodiments, a protection layer 503 is disposed on the heat sink 501 to prevent the heat sink 501 from oxidation. In some embodiments, at least one fourth conductive pillar 133 is disposed on the third electronic component 127. A fourth conductive via 141 is disposed on the fourth conductive pillar 133. The electronic package 6 further includes a redistribution layer (RDL) 401 on the circuit layer 161 and first electrical conductors 165 on the RDL layer 401.

Figure 7A:
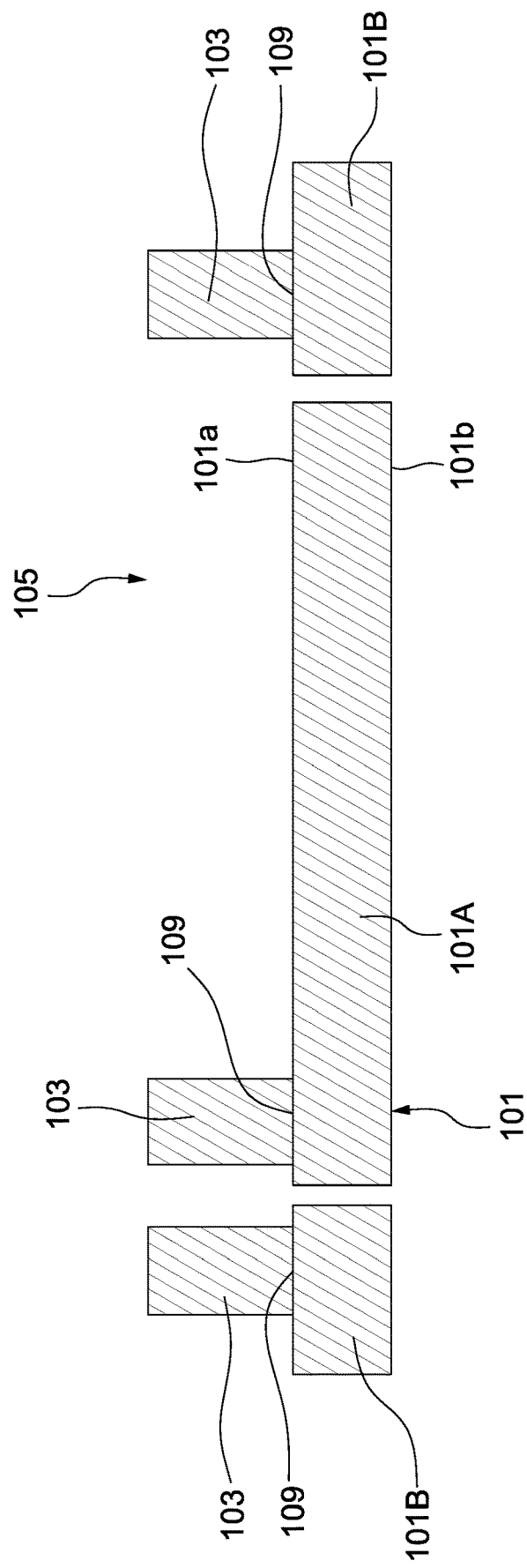
FIG. 7A, FIG. 7B, FIG. 7C, FIG. 7D, FIG. 7E, FIG. 7F and FIG. 7G illustrate various stages of a method for manufacturing an electronic package in accordance with some embodiments of the present disclosure.
Figure 7B:
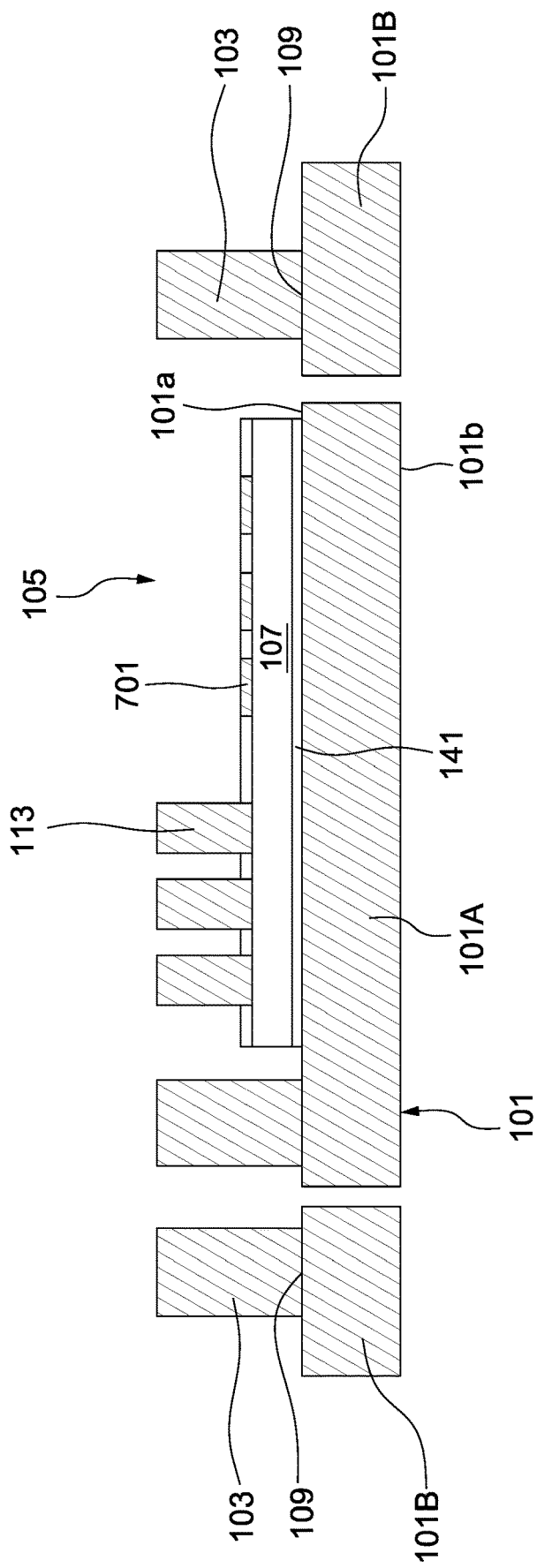
Figure 7C:
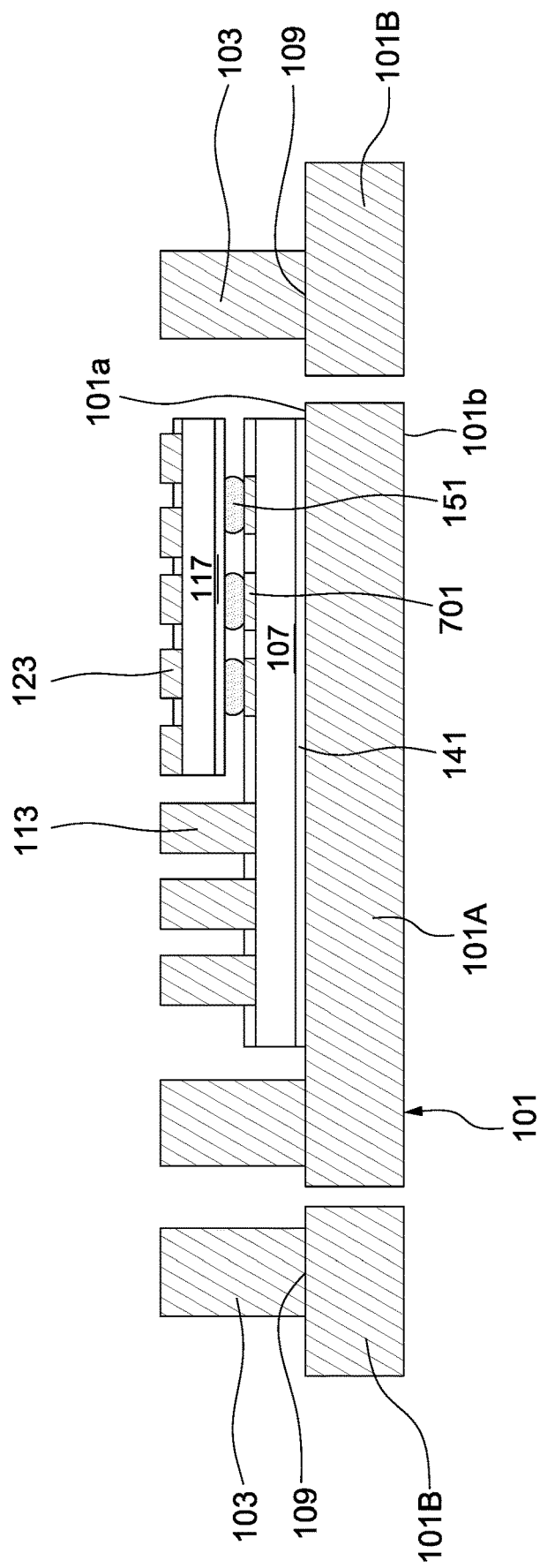
Figure 7D:
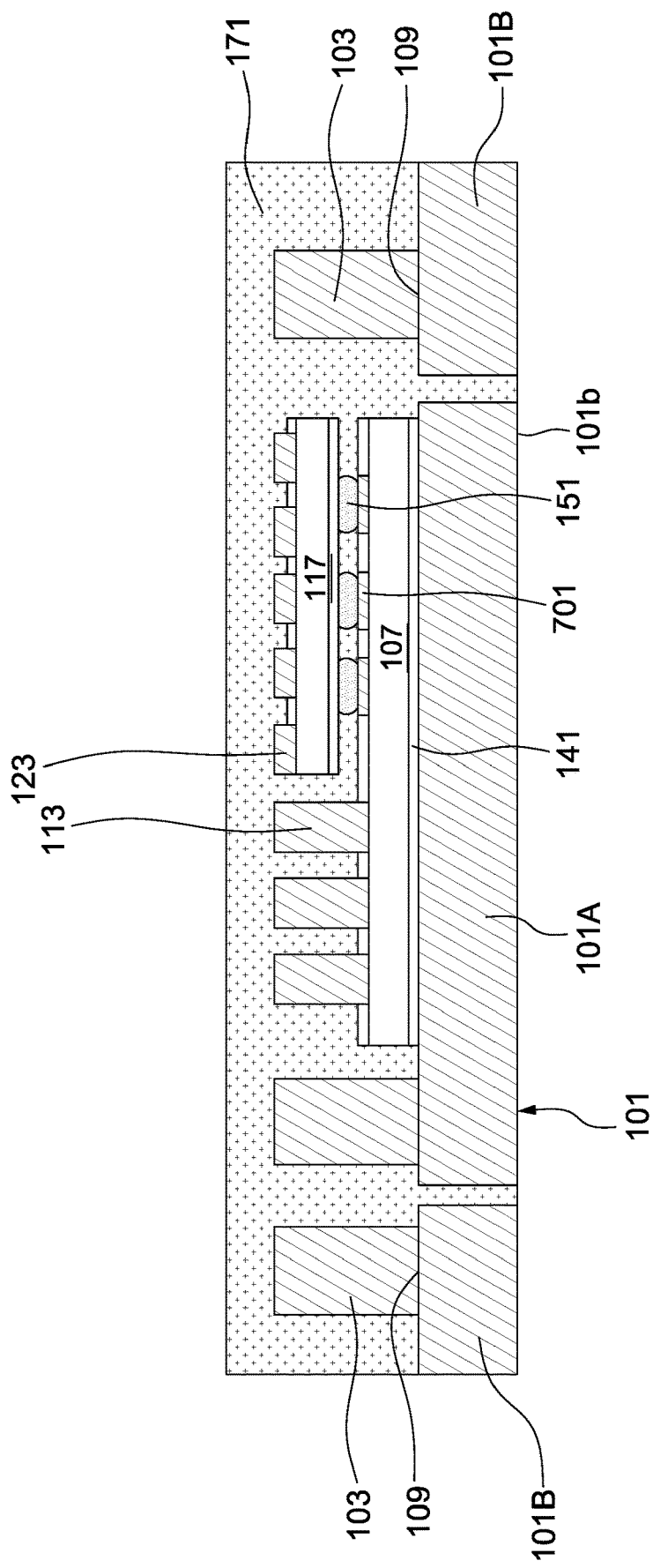

FIG. 7A, FIG. 7B, FIG. 7C, FIG. 7D, FIG. 7E, FIG. 7F and FIG. 7G illustrate various stages of a method for manufacturing an electronic package in accordance with some embodiments of the present disclosure. As shown in FIG. 7A, a patterned conductive layer 101 is provided. The patterned conductive layer has a first surface 101*a* and a second surface 101*b* opposite to the first surface 101*a*. The patterned conductive layer includes a die paddle region 101A and a lead region 101B around the die paddle region 101A. At least one conductive protrusion 103 are formed on the first surface 101*a* of the patterned conductive layer 101 by an additive process to define a space 105 on the patterned conductive layer 101. An interface 109 is present between the at least one conductive protrusion 103 and the patterned conductive layer 101 due to the additive process. In some embodiments, a seed layer is disposed between the at least one conductive protrusion 103 and the patterned conductive layer 101. In some embodiments, the at least one conductive protrusion 103 are formed on the die paddle region 101A and the lead region 101B as shown in FIG. 7A. In some embodiments, the at least one conductive protrusion 103 are formed on the patterned conductive layer 101 by an electroplating process. As shown in FIG. 7B, a first electronic component 107 is disposed in the space 105 on the patterned conductive layer 101. The first electronic component 107 is attached to the first surface 101*a* of the patterned conductive layer 101 by a first attachment layer 141. A plurality of second conductive pillars 113 are formed on the first electronic component 107 by, for example, an electroplating process. In some embodiments, the first electronic component 107 includes a plurality of conductive pads 701. In some embodiments, the plurality of second conductive pillars 113 are formed on a portion of the plurality of conductive pads 701 and another portion of the plurality of conductive pads 701 are exposed or uncovered. As shown in FIG. 7C, a second electronic component 117 is disposed on the first electronic component 107 and adjacent to the second conductive pillars 113. The second electronic component 117 is attached to and electrically connected to the first electronic component 107 by a conductive structure 151. A plurality of third conductive pillars 123 are formed on the second electronic component 117 by, for example, an electroplating process. As shown in FIG. 7D, a dielectric layer 171 is formed to encapsulate the patterned conductive layer 101, the first conductive pillars 103, the second conductive pillars 113, the third conductive pillars 123, the first electronic component 107 and the second electronic component 117.

Figure 7E:
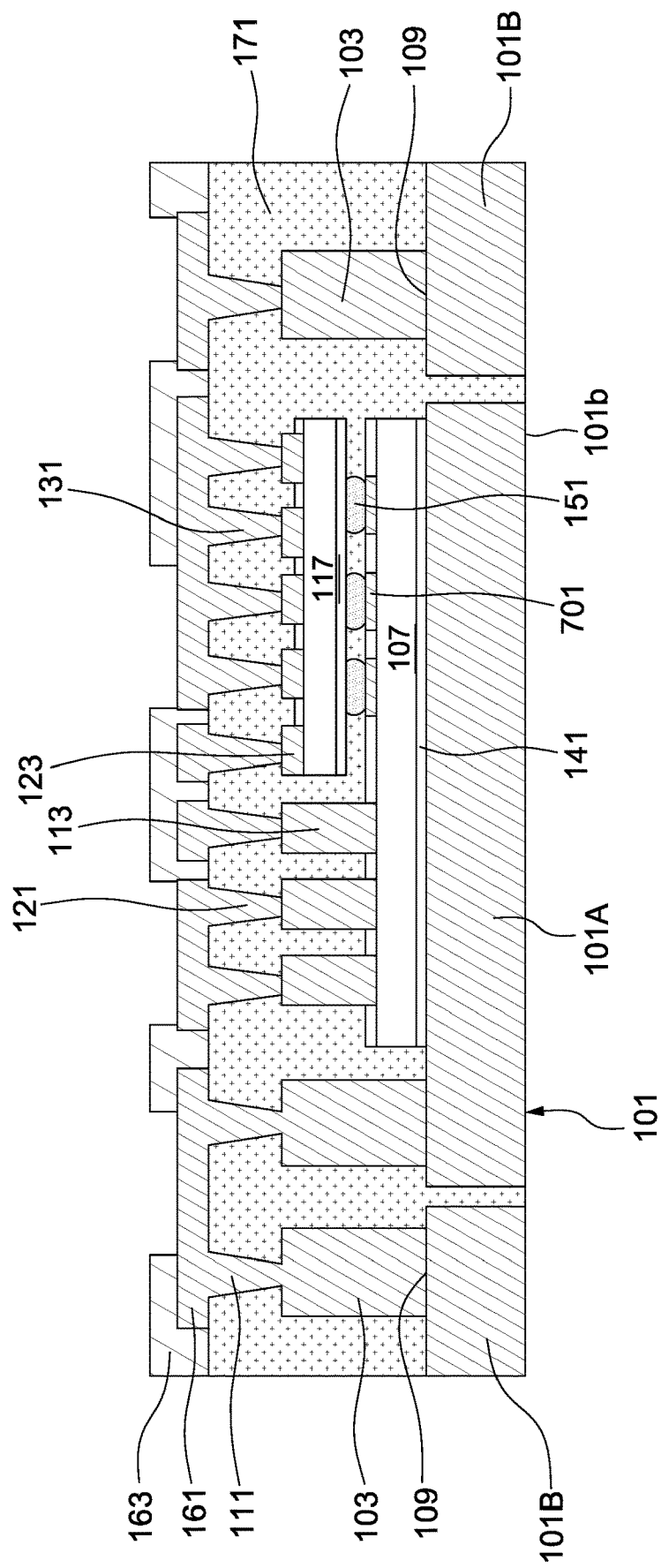

As shown in FIG. 7E, first conductive vias 111 are formed on the first conductive pillars 103, second conductive vias 121 are formed on the second conductive pillars 113, and third conductive vias 131 are formed on the third conductive pillars 123. In some embodiments, before the first, second and third conductive vias 111, 121, 131 are formed, a portion of the dielectric layer 171 is removed to expose the first conductive pillars 103, the second conductive pillars 113, and the third conductive pillars 123. In some examples, a portion of the dielectric layer 171 is removed by drilling vias in the dielectric layer 171 to expose upper surfaces of the first conductive pillars 103, the second conductive pillars 113, and the third conductive pillars 123. In some examples, a portion of the dielectric layer 171 is removed by grinding the dielectric layer 171 until the upper surfaces of the first conductive pillars 103, the second conductive pillars 113, and the third conductive pillars 123 are exposed. In some embodiments, the first conductive vias 111, the second conductive vias 121 and the third conductive vias 131 are formed by drilling vias in the dielectric layer 171 using, for example, a laser beam, followed by filling the drilled vias with a conductive material. In alternative embodiments, the first conductive vias 111, the second conductive vias 121 and the third conductive vias 131 are formed by grinding the dielectric layer 171 to provide a first portion of the dielectric layer, such as the first dielectric layer 107A shown in FIG. 2B, forming and patterning a second portion of the dielectric layer 171, such as the second dielectric layer 171B shown in FIG. 2B, on the first portion of the dielectric layer 171, and forming a conductive material on the patterned second portion of the dielectric layer. The second conductive via 121 and the third conductive via 131 are formed on the second conductive pillar 113 and the second conductive pillar 123, respectively, instead of directly on contacts pads of the first electronic component 107 and the second electronic component 117. Therefore, damage to the electronic components 107, 117 caused by a process for forming the conductive vias by, e.g., laser drilling, can be prevented or at least mitigated. In addition, the first conductive pillars 103, the second conductive pillars 113 and the third conductive pillars 123 allow the first conductive vias 111, the second conductive vias 121 and the third conductive vias 131 to have similar aspect ratios. As a result, a process for forming the first conductive via 111, the second conductive via 121 and the third conductive via 131 can be simplified and can be controlled more accurately.

Figure 7F:
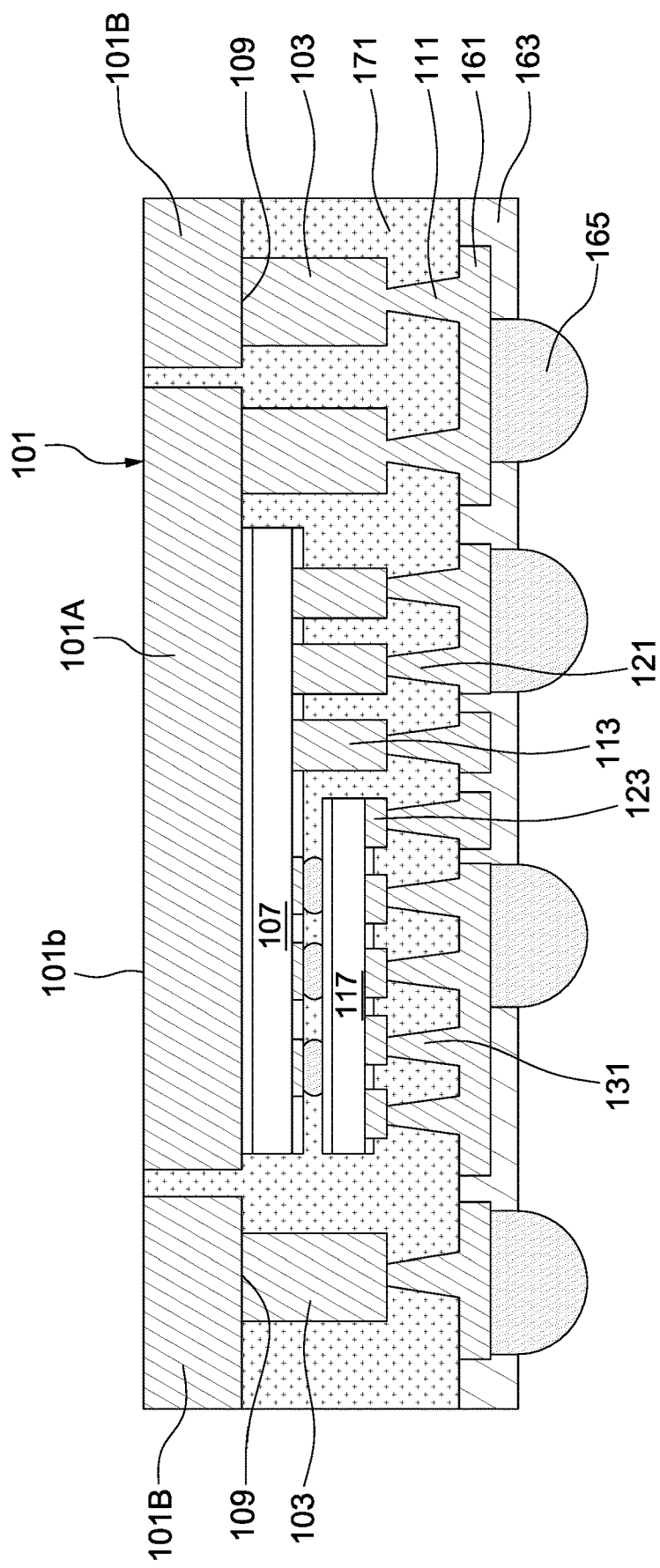

Still referring to FIG. 7E, a circuit layer 161 is formed on and patterned to interconnect the first conductive vias 111, the second conductive vias 121 and/or the third conductive vias 131. In some embodiments, the circuit layer 161 electrically connects a first conductive pillar 103 on the die paddle region 101A of the patterned conductive layer 101 to another first conductive pillar 103 on the lead region 101B of the patterned conductive layer 101, such that the first conductive pillar 103 on the die paddle region 101B is electrically connected to the lead region 101B. A passivation layer 163 is formed on the circuit layer 161 and patterned to expose portions of the circuit layer 161. Referring to FIG. 7F, first electrical conductors 165, such as solder balls or the like, are formed on the exposed portion of the circuit layer 161. As a result, a ball grid array (BGA) electronic package is formed.

Figure 7G:
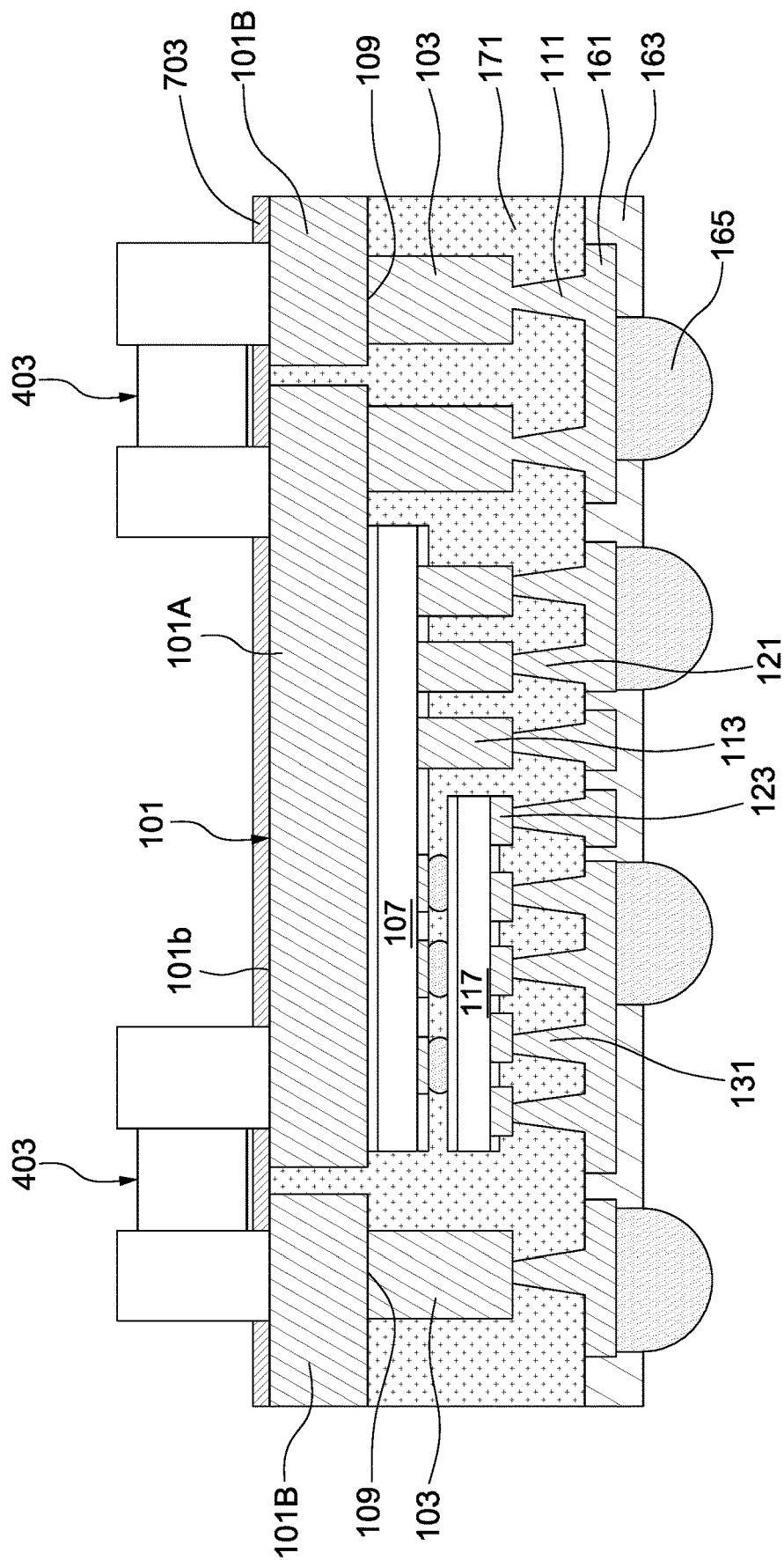

In some embodiments as shown in FIG. 7G, at least one electronic device 403 is disposed on the second surface 101b of the patterned conductive layer 101. In some embodiments, the electronic device 403 is a passive device, such as a resistor, a capacitor or an inductor. In some embodiments, the electronic device 403 is attached to the second surface 101b of the patterned conductive layer 101 by a solder material or conductive adhesive (not shown). In some embodiments, a patterned insulating layer 703, such as a solder mask/resist or an over molding layer, is disposed on the second surface 101b of the patterned conductive layer 101 to prevent solder extrusion of the electronic device 403. In some embodiments, the electronic device 403 is electrically connected to the lead region 101B of the patterned conductive layer 101. In some embodiments, the electronic device 403 is electrically connected to the die paddle region 101A of the patterned conductive layer 101.

Figure 8A:
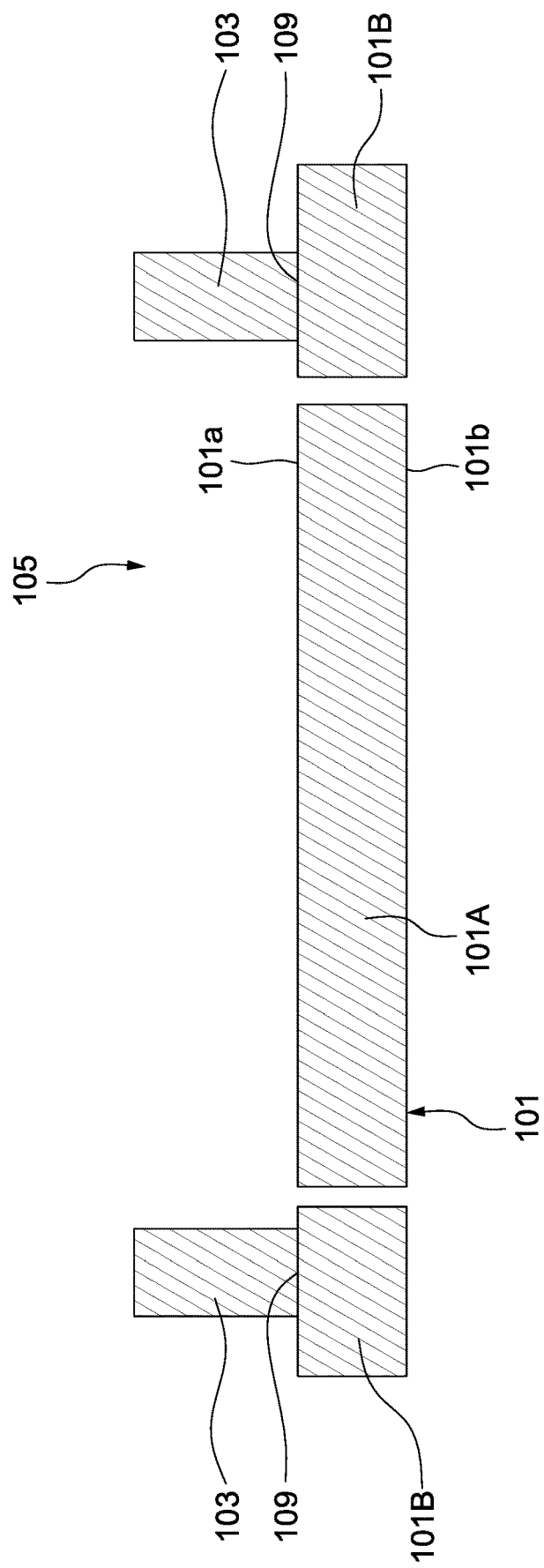
FIG. 8A, FIG. 8B, FIG. 8C, FIG. 8D, FIG. 8E and FIG. 8F illustrate various stages of a method for manufacturing an electronic package in accordance with some embodiments of the present disclosure.
Figure 8B:
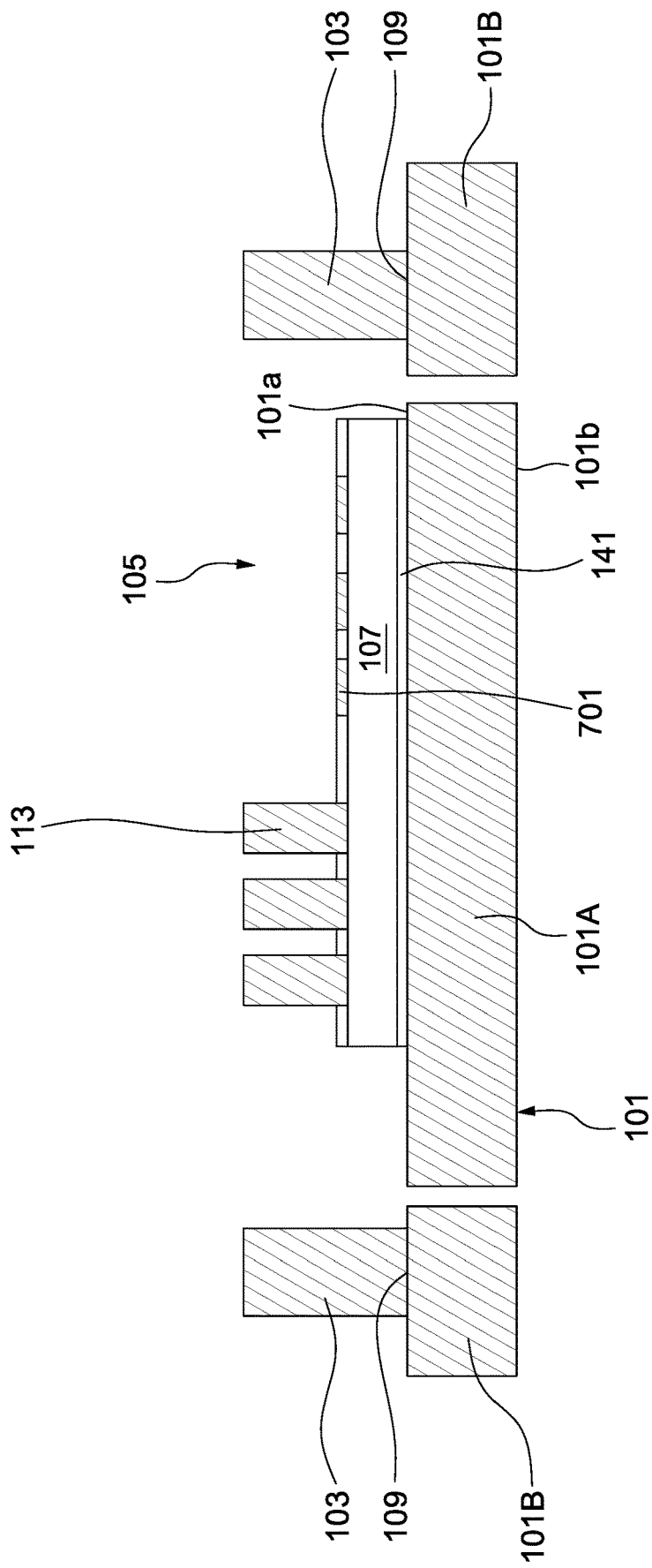
Figure 8C:
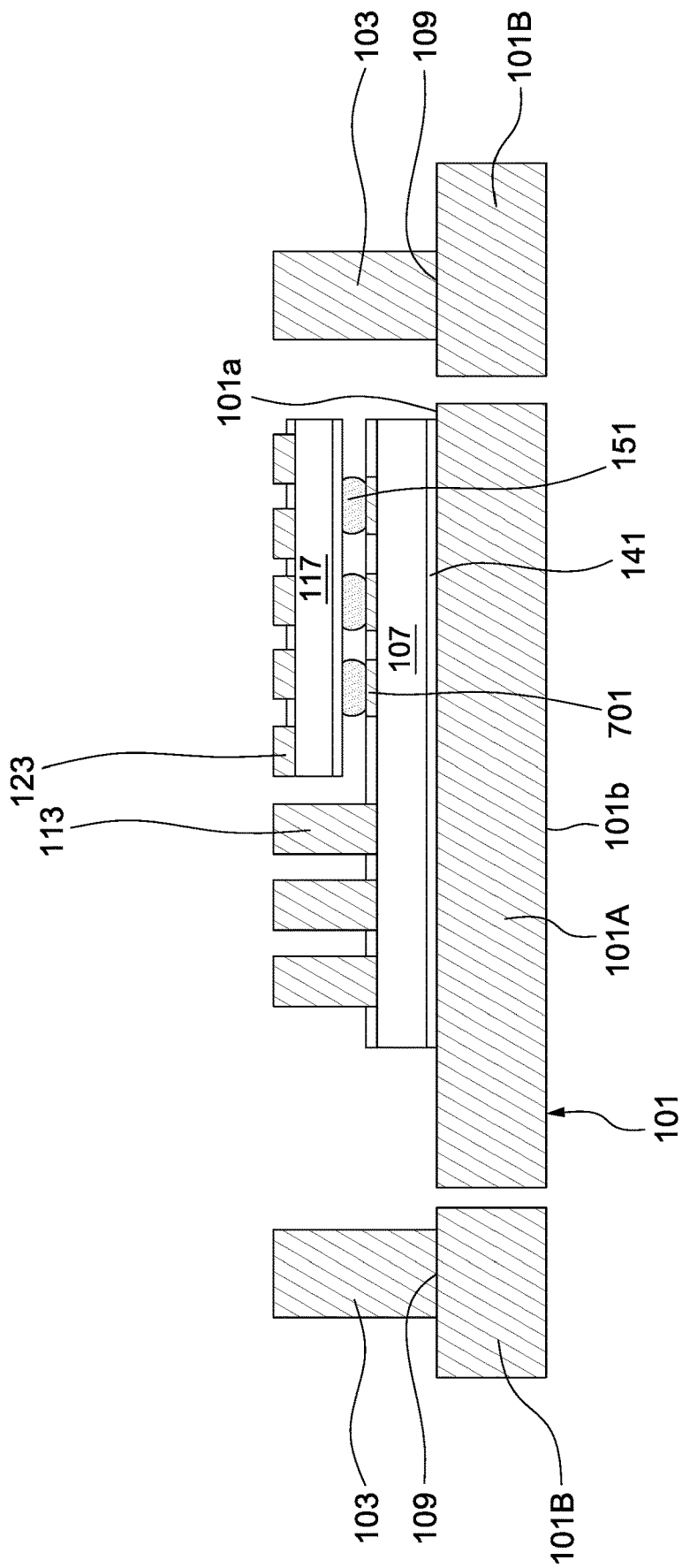
Figure 8D:
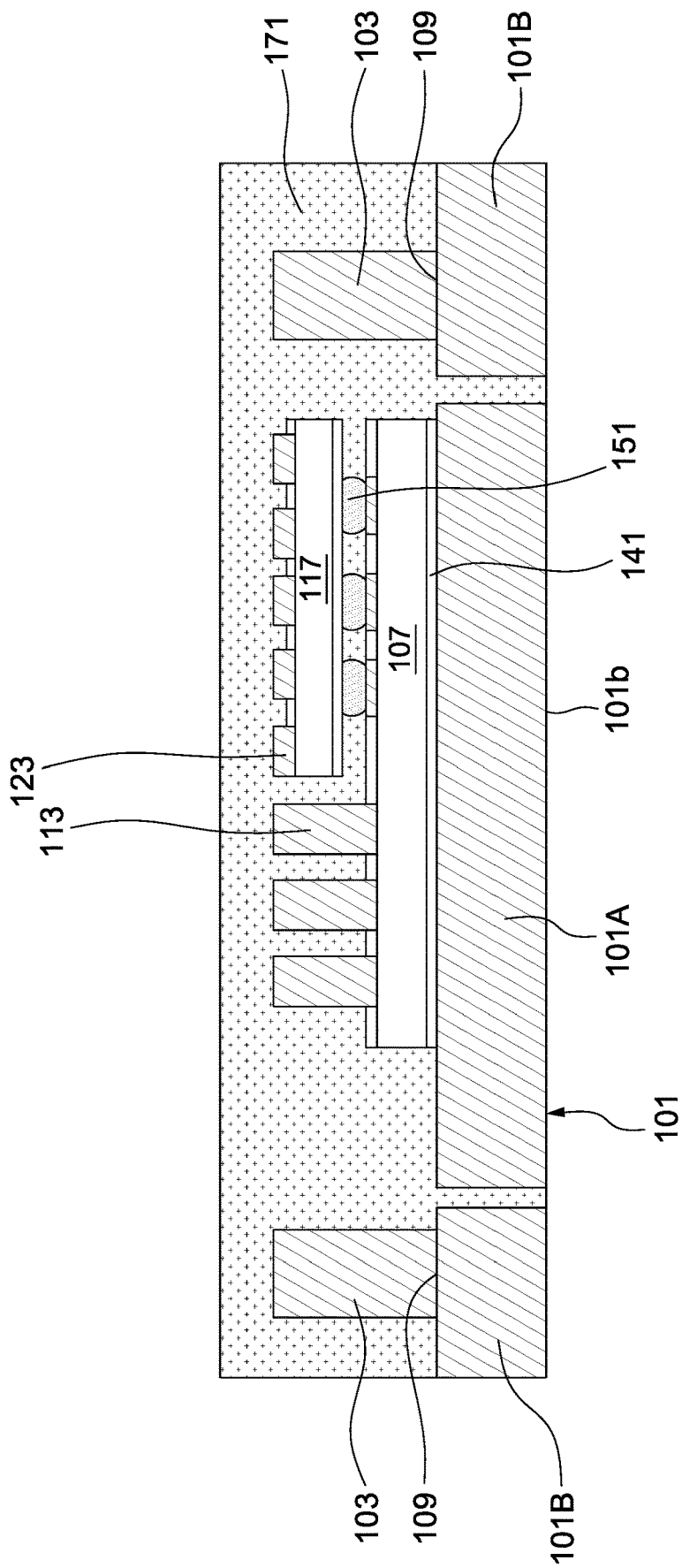
Figure 8E:
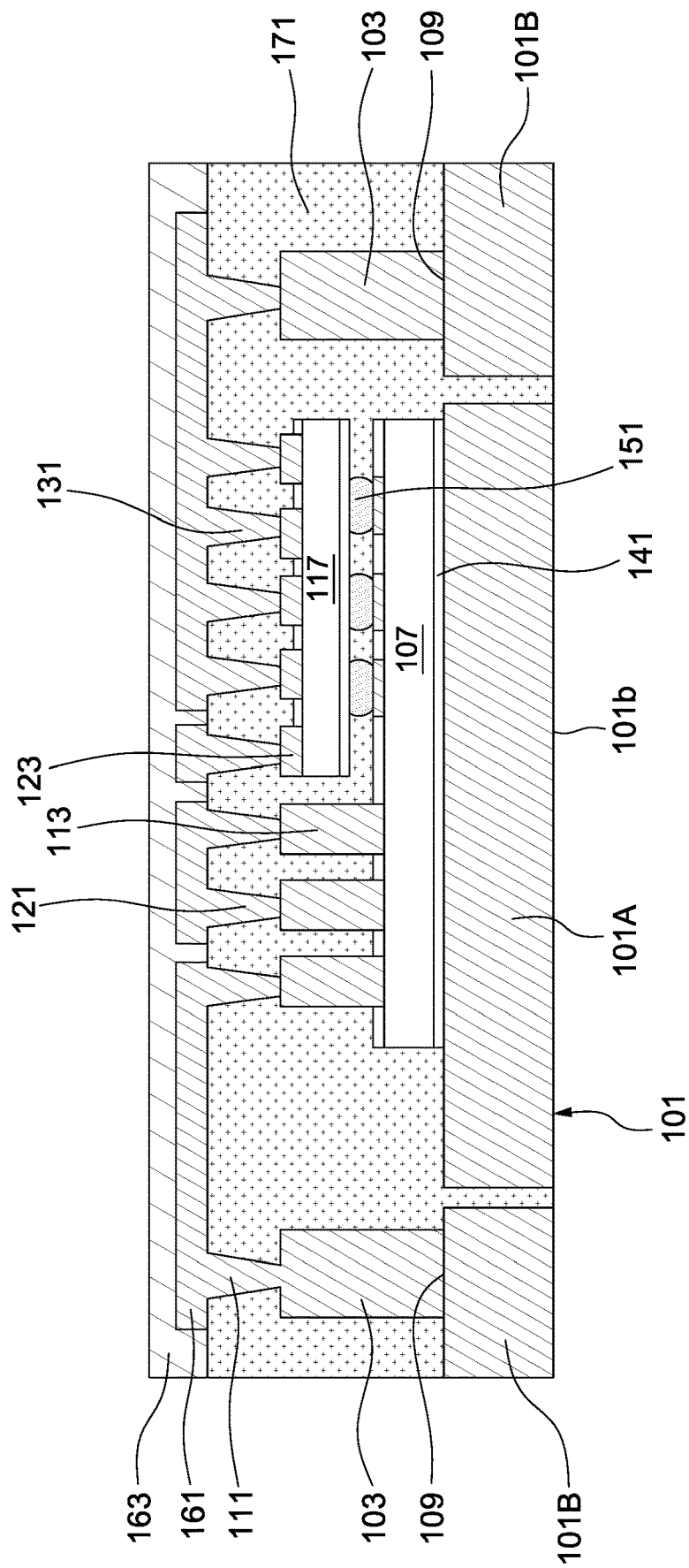
Figure 8F:
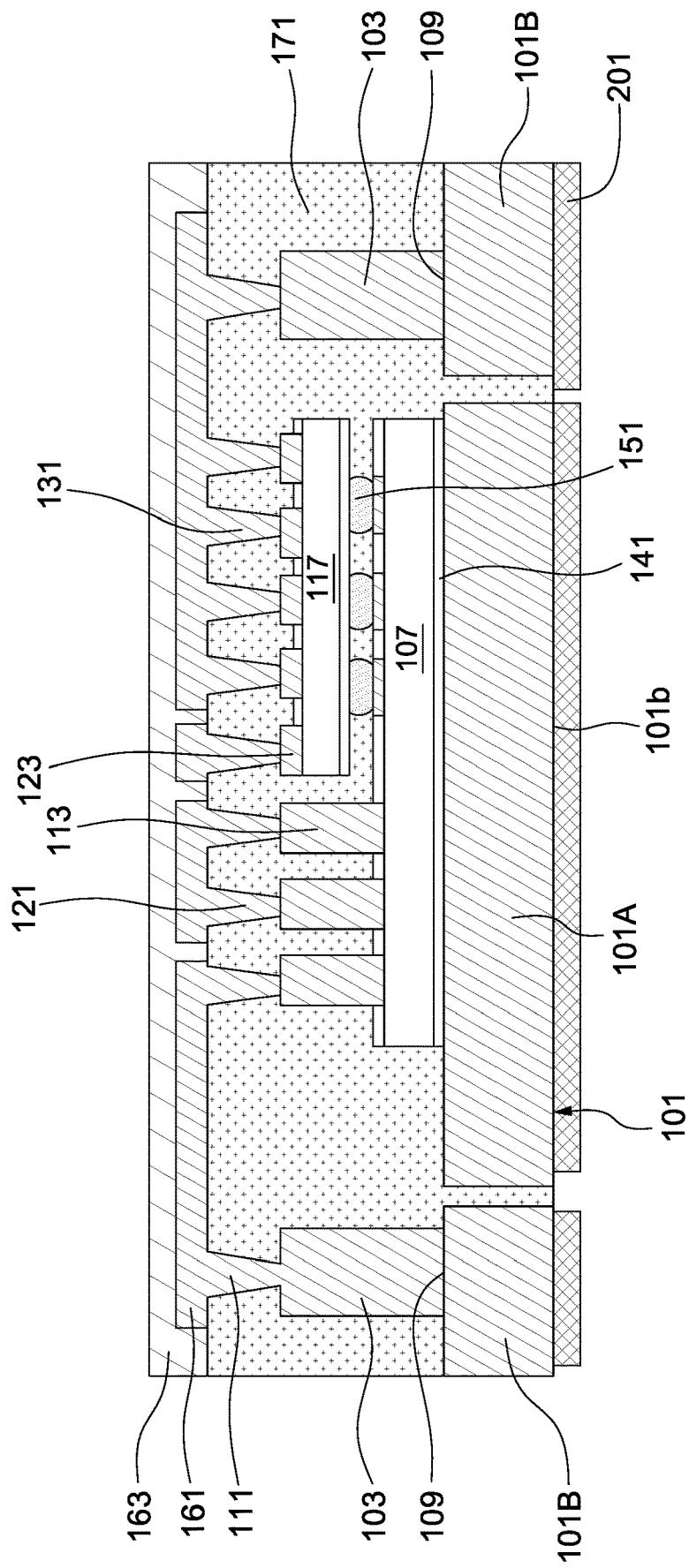

FIG. 8A, FIG. 8B, FIG. 8C, FIG. 8D, FIG. 8E and FIG. 8F illustrate various stages of a method for manufacturing an electronic package in accordance with some embodiments of the present disclosure. The stages illustrated in FIG. 8A, FIG. 8B, FIG. 8C, FIG. 8D and FIG. 8E are similar to the stages as described and illustrated with reference to FIG. 7A, FIG. 7B, FIG. 7C, FIG. 7D and FIG. 7E, respectively, except that the first conductive pillars 103 are formed only on the lead region 101B of the patterned conductive layer 101 and the passivation layer 163 covers or encapsulates the circuit layer 161 as shown in FIG. 8E. As shown in FIG. 8F, electrical conductors 201, such as solder pastes or the like, is disposed on the second surface 101b of the patterned conductive layer 101. As a result, a land grind array (LGA) electronic package is formed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially parallel" can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially perpendicular" can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. In addition, a first surface of an object is "substantially level" with a second surface of another object if the first surface and the second surface are at the same plane within a variation of ±10%, such as ±5%, ±4%, ±3%, ±2%, ±1%, ±0.5%, ±0.1% or ±0.05%, of a height/length of the object.

As used herein, the singular terms "a," "an," and "the" may include plural referents unless the context clearly dictates otherwise.

While the present disclosure has been described and illustrated with reference to specific embodiments thereof, these descriptions and illustrations are not limiting. It should be understood by those skilled in the art that various changes may be made, and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:
a patterned conductive layer;
at least one conductive protrusion on the patterned conductive layer, the at least one conductive protrusion having a first top surface, wherein the patterned conductive layer and the at least one conductive protrusion define a space;
a first electronic component disposed in the space; and
a plurality of conductive pillars on the first electronic component, the conductive pillars having a second top surface,
wherein the first top surface is substantially level with the second top surface, and
wherein the patterned conductive layer comprises a leadframe including a die paddle region and a lead region around the die paddle region, the at least one conductive protrusion is disposed on the lead region, the lead region has a first surface in contact with the at least one conductive protrusion and a second surface opposite to the first surface, and a roughness of the first surface of the lead region is substantially the same as a roughness of the second surface of the lead region.

2. The electronic package of claim 1, wherein the patterned conductive layer and the at least one conductive protrusion are metallographically distinct.

3. The electronic package of claim 1, further comprising a second electronic component stacked on the first electronic component and aside at least one of the conductive pillars.

4. The electronic package of claim 3, further comprising a conductive structure between the first electronic component and the second electronic component, wherein the conductive structure electrically connects the second electronic component to the first electronic component.

5. An electronic package, comprising:
a patterned conductive layer;
at least one conductive protrusion on the patterned conductive layer, the at least one conductive protrusion having a first top surface, wherein the patterned conductive layer and the at least one conductive protrusion define a space;
a first electronic component disposed in the space;
a plurality of conductive pillars on the first electronic component, the conductive pillars having a second top surface; and
a first conductive via on the at least one conductive protrusion and a second conductive via on the conductive pillar, wherein a depth of the first conductive via is substantially the same as a depth of the second conductive via,
wherein the first top surface is substantially level with the second top surface.

6. An electronic package, comprising:
a patterned conductive layer;
at least one conductive protrusion on the patterned conductive layer, wherein the patterned conductive layer and the at least one conductive protrusion define a space;
a first electronic component disposed in the space;
a second electronic component stacked on the first electronic component and uncovering a portion of the first electronic component;
a plurality of first conductive pillars on the portion of the first electronic component; and
a dielectric layer embedding the first electronic component and the second electronic component.

7. The electronic package of claim 6, wherein the second electronic component is electrically connected to the first electronic component.

8. The electronic package of claim 6, further comprising a second conductive pillar on the second electronic component, wherein the first conductive pillars have a first lower surface in contact with the first electronic component and a first upper surface opposite to the first lower surface; the second conductive pillar has a second lower surface in contact with the second electronic component and a second upper surface opposite to the second lower surface; and the first upper surface is substantially level with the second upper surface.

9. The electronic package of claim 6, further comprising a first conductive via on the at least one conductive protrusion and a second conductive via on the first conductive pillars.

10. The electronic package of claim 9, wherein a depth of the first conductive via is substantially the same as a depth of the second conductive via.

11. The electronic package of claim 6, wherein the patterned conductive layer comprises a leadframe having a first surface and a second surface opposite to the first surface, and the at least one conductive protrusion and the first electronic component are disposed on the first surface of the leadframe.

12. The electronic package of claim 11, further comprising a third electronic component over the first surface of the leadframe.

13. The electronic package of claim 12, further comprising a heat sink disposed over the first surface of the leadframe.

14. The electronic package of claim 13, further comprising a second attachment layer between the third electronic component and the heat sink, wherein the second attachment layer is thermally connected between the third electronic component and the heat sink.

15. The electronic package of claim 14, further comprising an encapsulant encapsulating the third electronic component and the second attachment layer.

16. The electronic package of claim 6, further comprising a first attachment layer between the first electronic component and the patterned conductive layer, wherein the first attachment layer is electrically conductive.

17. The electronic package of claim 6, further comprising a circuit layer on the dielectric layer, wherein the circuit layer is electrically connected to the at least one conductive protrusion and/or the first conductive pillars.

18. The electronic package of claim 17, further comprising an electronic device on the circuit layer, wherein the electronic device is electrically connected to the circuit layer.

* * * * *